US012324207B2

(12) United States Patent
Bhuiyan et al.

(10) Patent No.: US 12,324,207 B2
(45) Date of Patent: Jun. 3, 2025

(54) CHANNEL PROTECTION OF GATE-ALL-AROUND DEVICES FOR PERFORMANCE OPTIMIZATION

(71) Applicant: International Business Machines Corporation, Armonk, NY (US)

(72) Inventors: Maruf Amin Bhuiyan, Albany, NY (US); Julien Frougier, Albany, NY (US); Ruilong Xie, Niskayuna, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 669 days.

(21) Appl. No.: 17/457,634

(22) Filed: Dec. 3, 2021

(65) Prior Publication Data

US 2023/0178618 A1    Jun. 8, 2023

(51) Int. Cl.
    *H10D 64/01*    (2025.01)
    *H10D 30/01*    (2025.01)
    (Continued)

(52) U.S. Cl.
    CPC ......... *H10D 64/018* (2025.01); *H10D 30/024* (2025.01); *H10D 30/6713* (2025.01);
    (Continued)

(58) Field of Classification Search
    CPC ..... H01L 21/823412; H01L 21/823418; H01L 21/823431; H01L 21/823468; H01L 21/823481; H01L 21/823821; H01L 21/823864; H01L 29/0649; H01L 29/0673; H01L 29/1079; H01L 29/42392; H01L 29/66439; H01L 29/66553; H01L 29/6656; H01L 29/66795; H01L 29/775; H01L 29/785; H01L 29/78618; H01L 29/78696; B82Y 10/00; H10D 30/01; H10D 30/014; H10D 30/019–0198; H10D 30/024;
    (Continued)

(56) References Cited

U.S. PATENT DOCUMENTS 9,923,055 B1    3/2018   Cheng
10,224,343 B2   3/2019   Kim
(Continued)

OTHER PUBLICATIONS

International Searching Authority, "Notification of International Search Report and Written Opinion or Declaration", International Application No. PCT/IB2022/061459, Mailed Feb. 23, 2023, 13 pages.
(Continued)

*Primary Examiner* — Cheung Lee
(74) *Attorney, Agent, or Firm* — James L. Olsen

(57) ABSTRACT

A gate-all-around device includes a plurality of channel layers vertically stacked over a substrate, an inner spacer located between each of the plurality of channel layers, source/drain regions in contact with opposite ends of a first portion of the plurality of channel layers, and a first dielectric layer on opposite ends of a second portion of the plurality of channel layers located in a spacer region that is adjacent to the source/drain regions. A width of the first dielectric layer and the second portion of the plurality of channel layers is equal to a width of the inner spacer located between each of the plurality of channel layers.

20 Claims, 34 Drawing Sheets

(51) Int. Cl.
  *H10D 30/67*  (2025.01)
  *H10D 62/10*  (2025.01)
  *H10D 84/01*  (2025.01)
  *H10D 84/03*  (2025.01)

(52) U.S. Cl.
  CPC ..... *H10D 30/6735* (2025.01); *H10D 30/6757* (2025.01); *H10D 62/115* (2025.01); *H10D 62/121* (2025.01); *H10D 64/021* (2025.01); *H10D 84/0128* (2025.01); *H10D 84/013* (2025.01); *H10D 84/0147* (2025.01); *H10D 84/0151* (2025.01); *H10D 84/0158* (2025.01); *H10D 84/038* (2025.01)

(58) Field of Classification Search
  CPC ................ H10D 30/43; H10D 30/435; H10D 30/501–509; H10D 30/6713; H10D 30/6735; H10D 30/674; H10D 30/6757; H10D 62/115; H10D 62/121; H10D 62/364; H10D 64/018; H10D 64/021; H10D 84/01; H10D 84/0128; H10D 84/013; H10D 84/0147; H10D 84/0151; H10D 84/0153; H10D 84/0158; H10D 84/032; H10D 84/035; H10D 84/05; H10D 84/07; H10D 84/08
  See application file for complete search history.

(56) References Cited

U.S. PATENT DOCUMENTS

| | | |
|---|---|---|
| 10,403,738 B1 | 9/2019 | Sung |
| 10,903,317 B1 | 1/2021 | Frougier |
| 10,910,470 B1 | 2/2021 | Wu |
| 10,991,626 B2 | 4/2021 | Smith |
| 2020/0083352 A1 | 3/2020 | Chanemougame |
| 2020/0220017 A1 | 7/2020 | Rachmady |
| 2020/0266060 A1* | 8/2020 | Cheng ............... H10D 62/116 |
| 2020/0381545 A1 | 12/2020 | Chiang |
| 2021/0126135 A1 | 4/2021 | Lee |

OTHER PUBLICATIONS

Yeung, et al., "Channel Geometry Impact and Narrow Sheet Effect of Stacked Nanosheet", 2018 IEEE International Electron Devices Meeting (IEDM), 2018, pp. 28.6.1-28.6.4, <https://ieeexplore.ieee.org/document/8614608>.

* cited by examiner

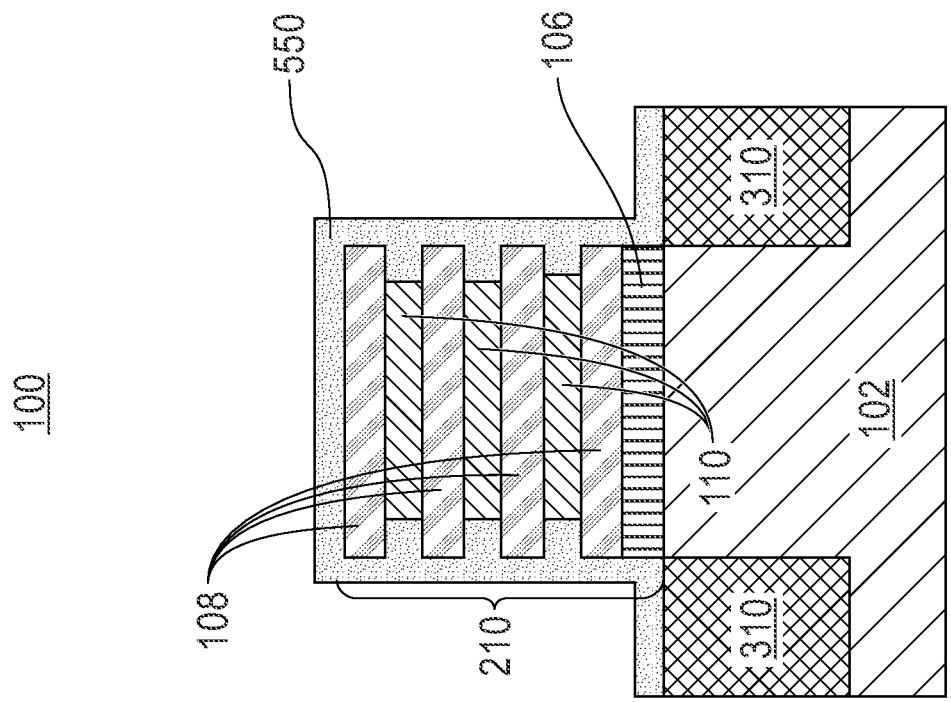
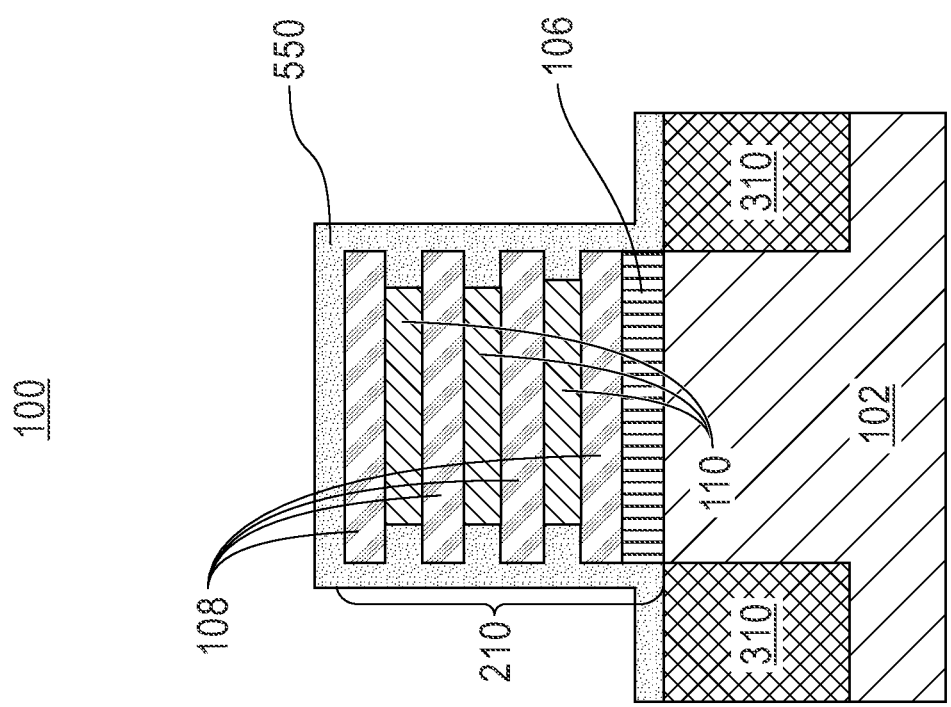
FIG. 6B
FIG. 6C

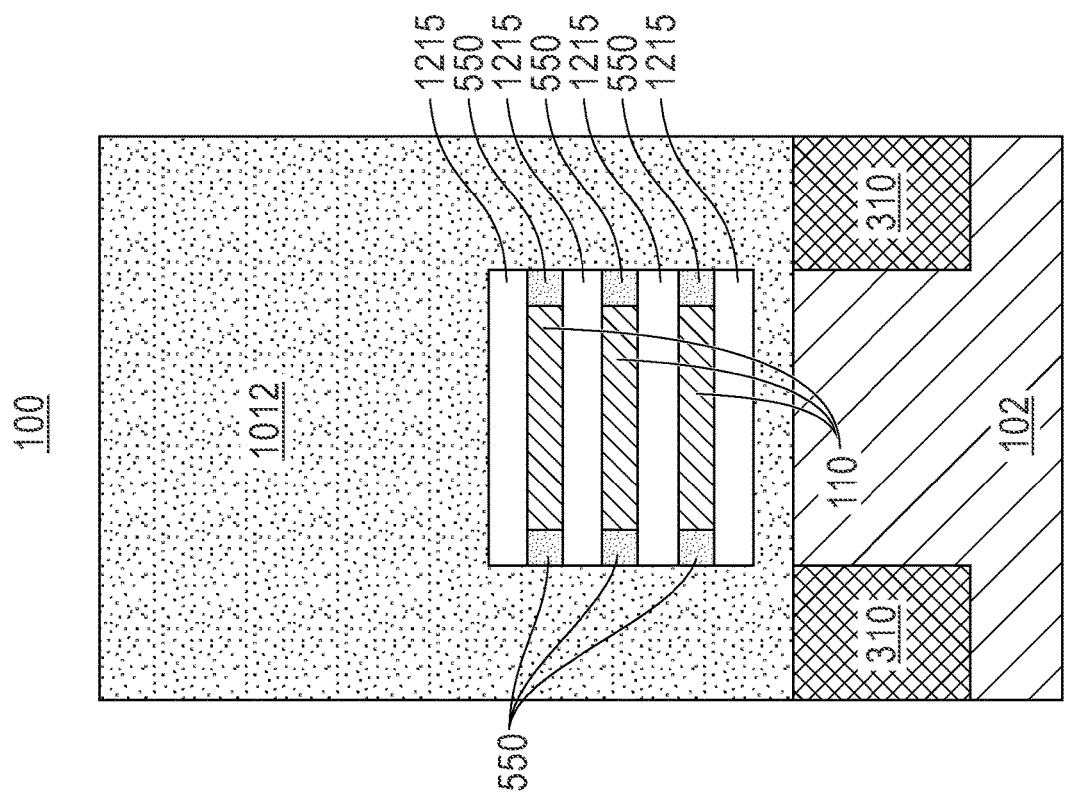
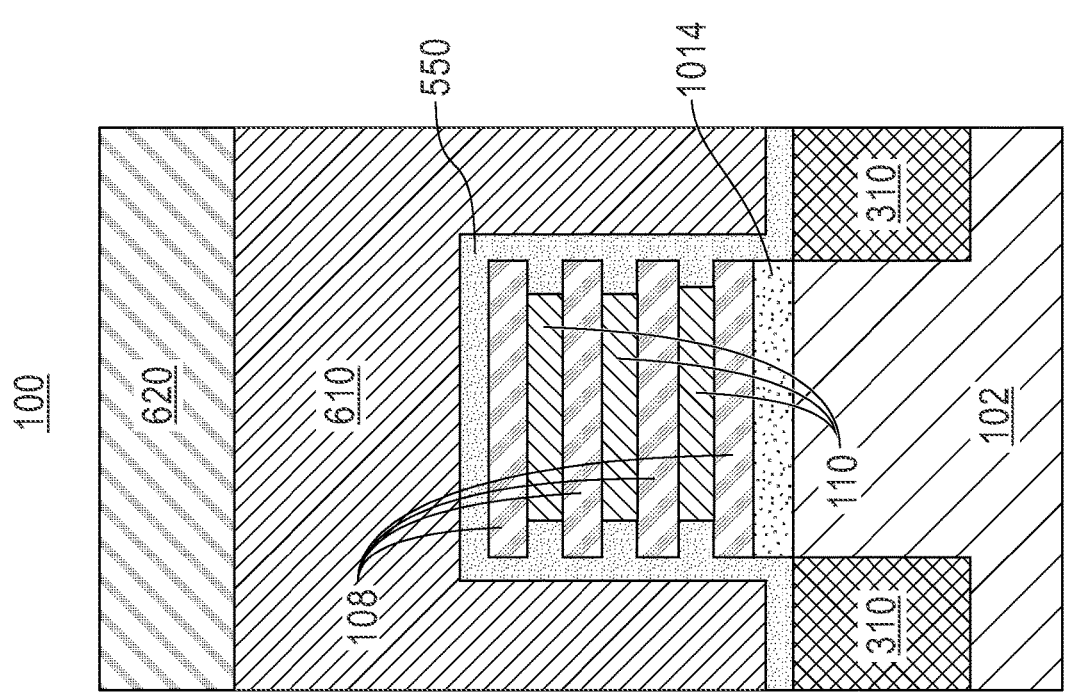
FIG. 13C
FIG. 13B

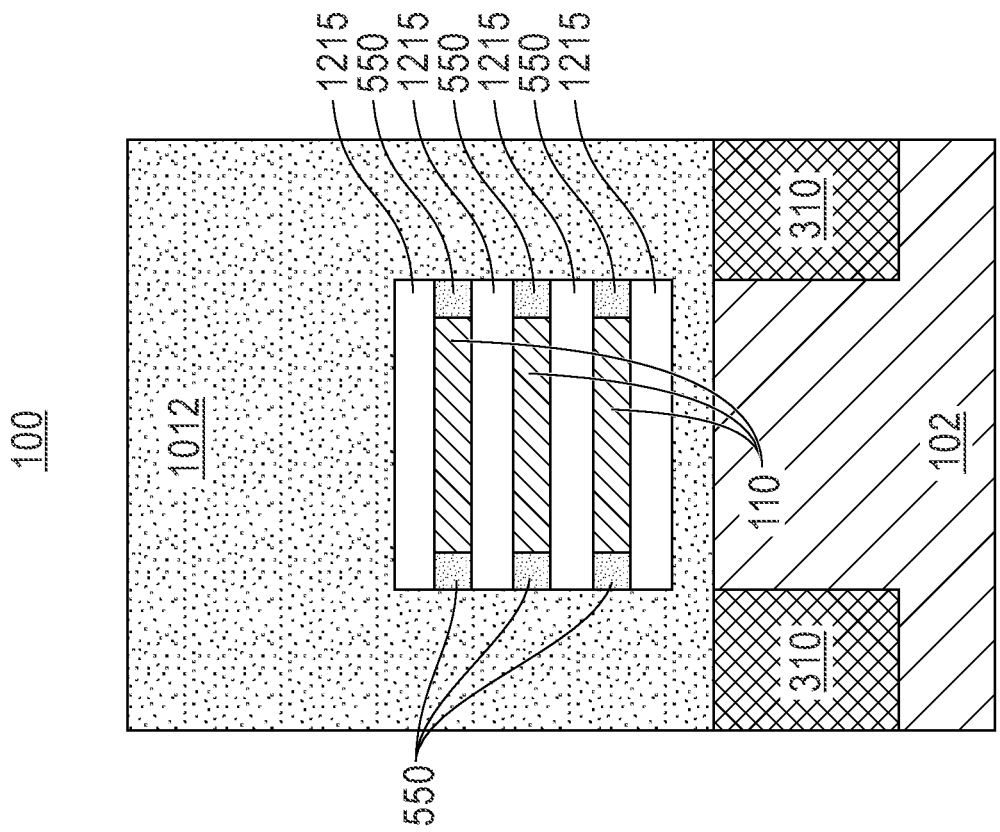
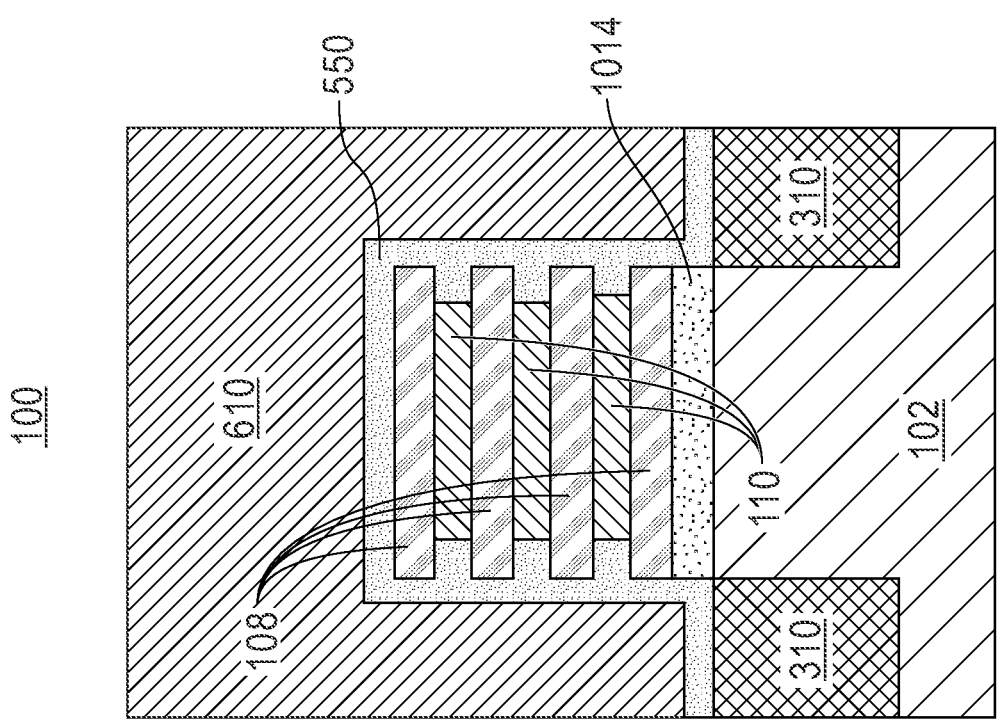
FIG. 15C
FIG. 15B

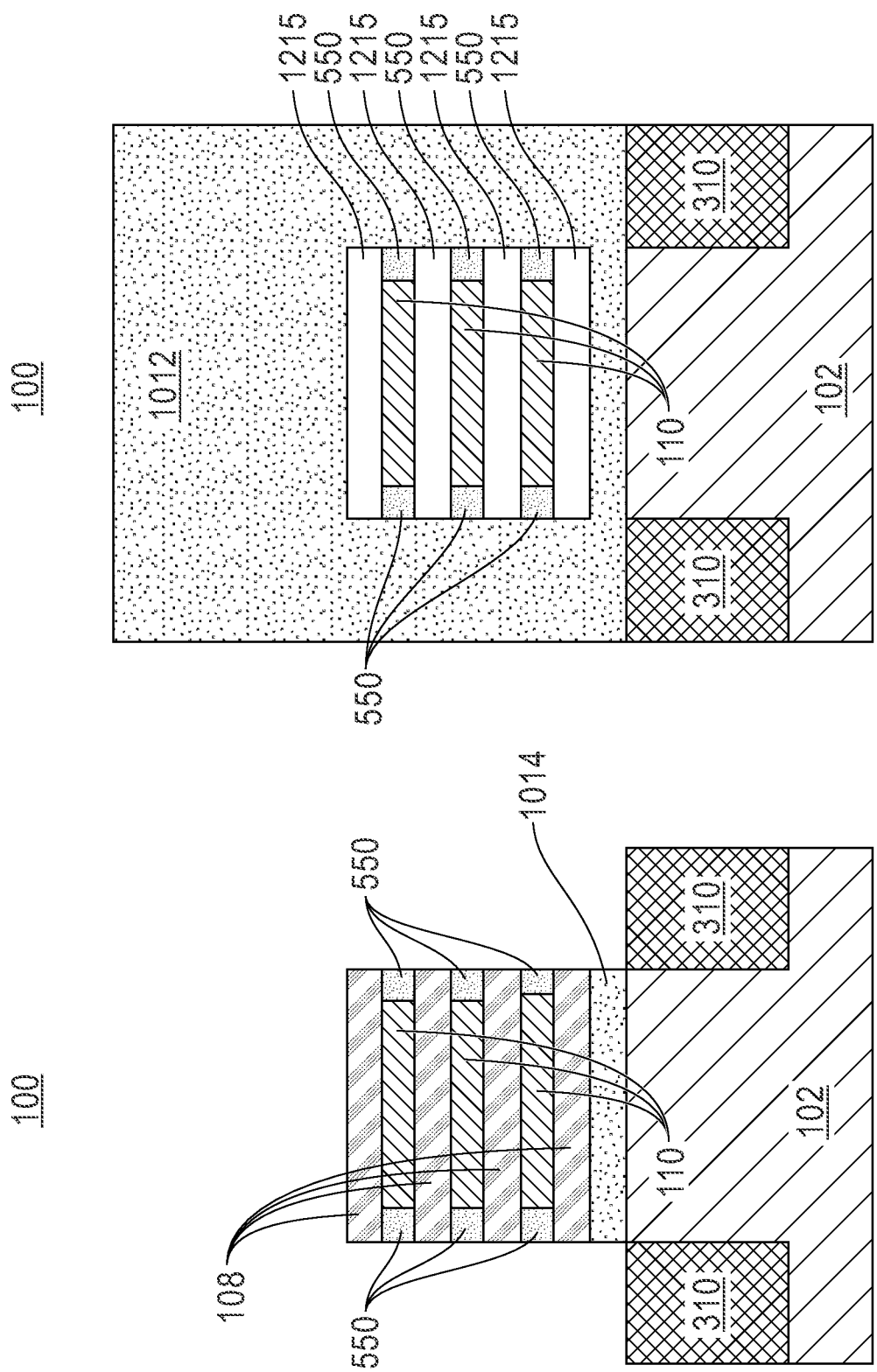

CHANNEL PROTECTION OF GATE-ALL-AROUND DEVICES FOR PERFORMANCE OPTIMIZATION

BACKGROUND

The present invention generally relates to the field of complementary metal-oxide semiconductor (CMOS) devices, and more particularly to nanosheet field effect transistor devices.

In contemporary semiconductor device fabrication processes a large number of semiconductor devices, such as field effect transistors (FETs), are fabricated on a single wafer. Some non-planar device architectures, including nanosheet FETs, provide increased device density and increased performance over planar devices. In nanosheet FETs, in contrast to conventional FETs, the gate stack wraps around the full perimeter of each nanosheet, enabling fuller depletion in the channel region, and reducing short-channel effects. The wrap-around gate structures used in nanosheet devices also enable greater management of leakage current in the active regions, even as drive currents increase.

Nanosheet FETs often include thin alternating layers (nanosheets) of different semiconductor materials arranged in a stack. Typically, nanosheets are patterned into nanosheet fins. Once the nanosheet fins are patterned, a gate stack is formed over a channel region of the nanosheet fins, and source/drain regions are formed adjacent to the gate stack. In some devices, once the gate stack or the source/drain regions have been formed, an etching process is performed to selectively remove sacrificial nanosheet layers of one of the dissimilar materials from the fins. The etching process results in the undercutting and suspension of the layers of the nanosheet fin (i.e., nanosheet channel layers) to form nanosheets or nanowires that can be used to form gate-all-around (GAA) devices. However, the etching process performed to selectively remove the sacrificial nanosheet layers from the nanosheet fin may damage the nanosheet channel layers which can negatively impact device performance. Thus, there is a need for improved designs and techniques for fabricating nanosheet field effect transistor devices.

SUMMARY

According to an embodiment of the present disclosure, a semiconductor structure includes a plurality of channel layers vertically stacked over a substrate, an inner spacer located between each of the plurality of channel layers, source/drain regions in contact with opposite ends of a first portion of the plurality of channel layers, and a first dielectric layer on opposite ends of a second portion of the plurality of channel layers located in a spacer region that is adjacent to the source/drain regions. A width of the first dielectric layer and the second portion of the plurality of channel layers is equal to a width of the inner spacer located between each of the plurality of channel layers.

According to another embodiment of the present disclosure, a method of forming a semiconductor structure includes forming a plurality of channel layers vertically stacked over a substrate, forming an inner spacer between each of the plurality of channel layers, forming source/drain regions in contact with opposite ends of a first portion of the plurality of channel layers, and forming a first dielectric layer on opposite ends of a second portion of the plurality of channel layers located on a spacer region that is adjacent to the source/drain regions. A width of the first dielectric layer and the second portion of the plurality of channel layers is equal to a width of the inner spacer located between each of the plurality of channel layers.

BRIEF DESCRIPTION OF THE DRAWINGS

The following detailed description, given by way of example and not intended to limit the invention solely thereto, will best be appreciated in conjunction with the accompanying drawings, in which:

FIG. 6B is a cross-sectional view of the semiconductor structure taken along line B-B', as shown in FIG. 1;

FIG. 6C is a cross-sectional view of the semiconductor structure 100 taken along line C-C', as shown in FIG. 1.

FIG. 13B is a cross-sectional view of the semiconductor structure taken along line B-B', as shown in FIG. 1;

FIG. 13C is a cross-sectional view of the semiconductor structure 100 taken along line C-C', as shown in FIG. 1;

FIG. 15B is a cross-sectional view of the semiconductor structure taken along line B-B', as shown in FIG. 1;

FIG. 15C is a cross-sectional view of the semiconductor structure 100 taken along line C-C', as shown in FIG. 1;

FIG. 17B is a cross-sectional view of the semiconductor structure taken along line B-B', as shown in FIG. 1;

FIG. 17C is a cross-sectional view of the semiconductor structure 100 taken along line C-C', as shown in FIG. 1;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2:
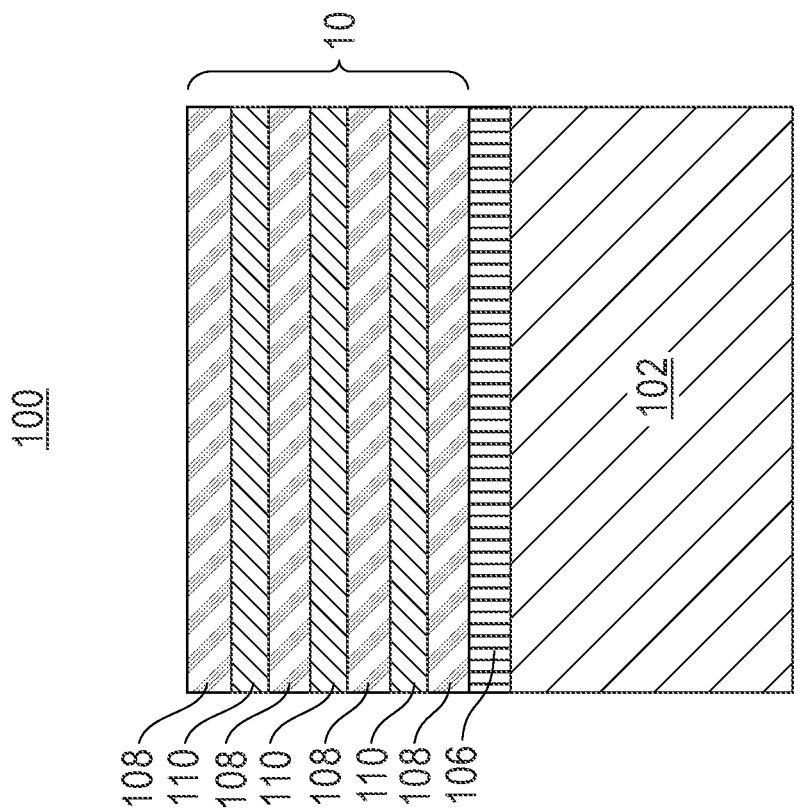
FIG. 2 is a cross-sectional view of the semiconductor structure taken along line B-B', as shown in FIG. 1, depicting forming a nanosheet stack above a semiconductor substrate, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Effective width ($W_{eff}$) and silicon (Si) channel thickness ($T_{si}$) are key structural elements that determine the performance of nanosheet (NS) transistors. Particularly, $W_{eff}$ strongly influences drive current of NS transistors, while $T_{si}$ determines the channel carrier mobility which in turn influences on-resistance (Ron) and drive current. Accordingly, process stability is crucial to ensure that both $W_{eff}$ and $T_{si}$ are close to their intended values.

During the processes of SiGe indentation and SiGe channel release, corner edges of the channel layers are exposed to etching gases and chemicals. This exposure leads to the formation of oval or meniscus structured nanosheet channels, which can cause $T_{si}$ reduction at the corners of the nanosheet channels and an overall $W_{eff}$ reduction. Lower $T_{si}$ and $W_{eff}$ can lead to unwanted effects like Ron and mobility degradation.

Therefore, embodiments of the present disclosure provide a semiconductor structure, and a method of making the same, in which indentation and etching of the sacrificial SiGe layers can be performed without damaging the Si channel layers in order to avoid $T_{si}$ and $W_{eff}$ reduction. Specifically, the proposed embodiments can prevent corner rounding of the Si nanosheet channels by forming a dielectric layer (e.g., an oxide dielectric) on opposite ends of the Si nanosheet channels such that the dielectric layer and the nanosheet channels under a spacer-gate region are sandwiched by the inner spacers for (laterally) protecting the edges of the nanosheet channels located on the spacer-gate region. Embodiments by which the dielectric layer can be formed to protect the edges of the nanosheet channels are described in detailed below by referring to the accompanying drawings in FIGS. 1-21C.

Figure 1:
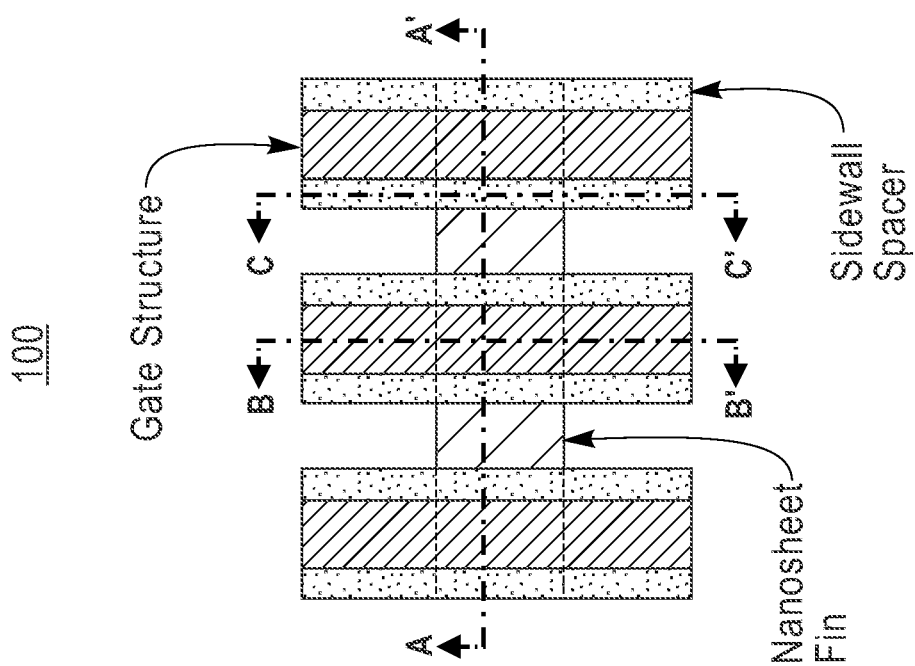
FIG. 1 is a top-down view of a semiconductor structure at an intermediate step during a semiconductor manufacturing process depicting different cross-sectional views, according to an embodiment of the present disclosure.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line A-A', line B-B' and line C-C'. As depicted in the figure, line A-A' represents a cut along a nanosheet fin structure or nanosheet fin region of the semiconductor structure 100, line B-B' represents a cut along a gate structure or gate region of the semiconductor structure 100, and line C-C' represents a cut along a sidewall spacer or spacer region surrounding or adjacent to the gate structure.

Referring now to FIG. 2, a cross-sectional view of the semiconductor structure 100 is shown after forming a nanosheet stack 10 above a semiconductor substrate 102, according to an embodiment of the present disclosure. In this embodiment, FIG. 2 is a cross-sectional view of the semiconductor structure 100 taken along line B-B', as depicted in FIG. 1.

An alternating sequence of layers of sacrificial semiconductor material and layers of semiconductor channel material vertically stacked one on top of another in a direction perpendicular to the semiconductor substrate 102 forms the nanosheet stack 10, as illustrated in the figure. Specifically, the alternating sequence includes a nanosheet stack sacrificial layer 106 above the semiconductor substrate 102, a sacrificial semiconductor layer 108 above the nanosheet stack sacrificial layer 106, and a semiconductor channel layer 110. In the example depicted in the figure, alternating sacrificial semiconductor layers 108 and semiconductor channel layers 110 are formed in a stack above the nanosheet stack sacrificial layer 106 on the semiconductor substrate 102. The term sacrificial, as used herein, means a layer or other structure, that is (or a part thereof is) removed before completion of the final device. For instance, in the example being described, portions of the sacrificial semiconductor layers 108 will be removed from the stack in the channel region of the device to permit the semiconductor channel layers 110 to be released from the nanosheet stack 10. It is notable that while in the present example the sacrificial semiconductor layers 108 and the semiconductor channel layers 110 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

According to an embodiment, the semiconductor substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the semiconductor substrate 102 may be approximately, but is not limited to, several hundred microns thick. In other embodiments, the semiconductor substrate 102 may be a layered semiconductor such as a silicon-on-insulator or SiGe-on-insulator, where a buried insulator layer, separates a base substrate from a top semiconductor layer.

With continued reference to FIG. 2, a first (sacrificial) layer in the stack, i.e., the nanosheet stack sacrificial layer 106, is formed on the semiconductor substrate 102. According to an exemplary embodiment, the nanosheet stack sacrificial layer 106 in the nanosheet stack 10 is formed using an epitaxial growth process. For instance, in the described embodiment, the nanosheet stack sacrificial layer 106 is formed by epitaxially growing a layer of SiGe with a higher germanium concentration varying between approximately 45 atomic percent to approximately 70 atomic percent. The higher concentration of germanium atoms allows the nanosheet stack sacrificial layer 106 to be removed selectively to the remaining alternating layers of the nanosheet stack 10, as will be described in detail below. By way of example only, the nanosheet stack sacrificial layer 106 may be formed having a thickness varying from approximately 5 nm to approximately 20 nm, although thicknesses greater than 20 nm and less than 5 nm may also be used.

In general, layers of the nanosheet stack 10 (e.g., SiGe/Si layers) can be formed by epitaxial growth by using the semiconductor substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the alternating sequence of SiGe/Si layers in the nanosheet stack 10. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIG. 2, similar to the nanosheet stack sacrificial layer 106, the sacrificial semiconductor layers 108 are formed by epitaxially growing a layer of SiGe. However, the germanium concentration of the sacrificial semiconductor layers 108 varies from approximately 15 atomic percent to approximately 35 atomic percent.

To continue building the nanosheet stack 10, the semiconductor channel layers 110 are formed by epitaxially growing a Si layer. As depicted in the figure, the nanosheet stack 10 is grown by forming (SiGe) sacrificial semiconductor layers 108 and (Si) semiconductor channel layers 110 in an alternating manner onto the nanosheet stack sacrificial layer 106. Accordingly, each of the sacrificial semiconductor layers 108 and the semiconductor channel layers 110 in the nanosheet stack 10 can be formed in the same manner as described above, e.g., using an epitaxial growth process, to a thickness varying from approximately 4 nm to approximately 10 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 110 in the nanosheet stack 10 will be used to form the channel layers of the device. Consequently, the dimensions of the semiconductor channel layers 110 dictate the dimensions of the channel region of the semiconductor structure 100. In some embodiments, the semiconductor channel layers 110 may include nanowires or nano-ellipses.

As mentioned above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate-all-around device that includes vertically stacked semiconductor channel material nanosheets for a positive channel Field Effect Transistor (hereinafter "p-FET") or a negative channel Field Effect Transistor (hereinafter "n-FET") device.

Figure 3:
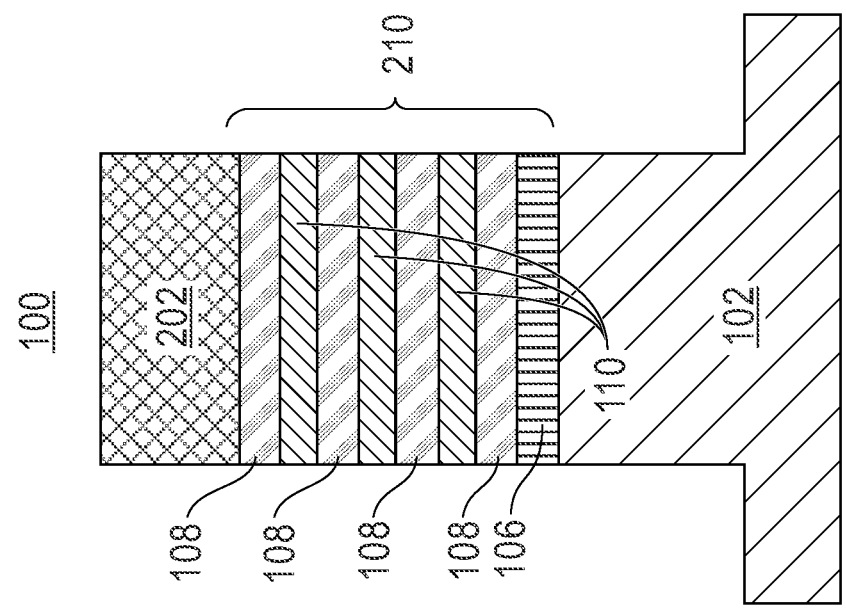
FIG. 3 is a cross-sectional view of the semiconductor structure taken along line B-B', as shown in FIG. 1, depicting patterning a nanosheet fin from the nanosheet stack, according to an embodiment of the present disclosure.

Referring now to FIG. 3, a cross-sectional view of the semiconductor structure 100 is shown after patterning a nanosheet fin 210 from the nanosheet stack 10 (FIG. 2), according to an embodiment of the present disclosure. In this embodiment, FIG. 3 is a cross-sectional view of the semiconductor structure 100 taken along line B-B', as depicted in FIG. 1.

Known processing techniques have been applied to the sequence of (SiGe) sacrificial semiconductor layers 108 and (Si) semiconductor channel layers 110 formed on the nanosheet stack sacrificial layer to form the nanosheet fin 210. For example, a fin hardmask 202 is formed over the nanosheet stack 10 (FIG. 2). The fin hardmask 202 can be formed by first depositing a hard mask material (e.g., silicon nitride) onto the nanosheet stack 10 (FIG. 2) using, for example, chemical vapor deposition (CVD), plasma enhanced CVD (PECVD) or any suitable technique for dielectric deposition. A photolithographic patterning is conducted on the deposited hardmask material to form a plurality of individual fin hardmasks. The patterning of the fin hardmask 202 is commensurate with a desired footprint and location of the semiconductor channel layers 110, which will be used to form the channel regions of the semiconductor device. According to an exemplary embodiment, reactive ion etching (RIE) is used to etch through the sacrificial semiconductor layers 108, semiconductor channel layers 110 and nanosheet stack sacrificial layer 106 to form the nanosheet fin 210.

Etching generally refers to the removal of a material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. RIE operates under conditions intermediate between sputter and plasma etching and may be used to produce deep, narrow features, such as shallow trench isolation (STI) trenches.

As shown in the figure, portions of the semiconductor substrate 102 can also be removed during the etching step to form STI trenches. It should be noted that portions of the semiconductor substrate 102 removed during the photolithographic patterning process are subsequently filled with an insulating material to form STI regions, as will be described in detail below.

Figure 4:
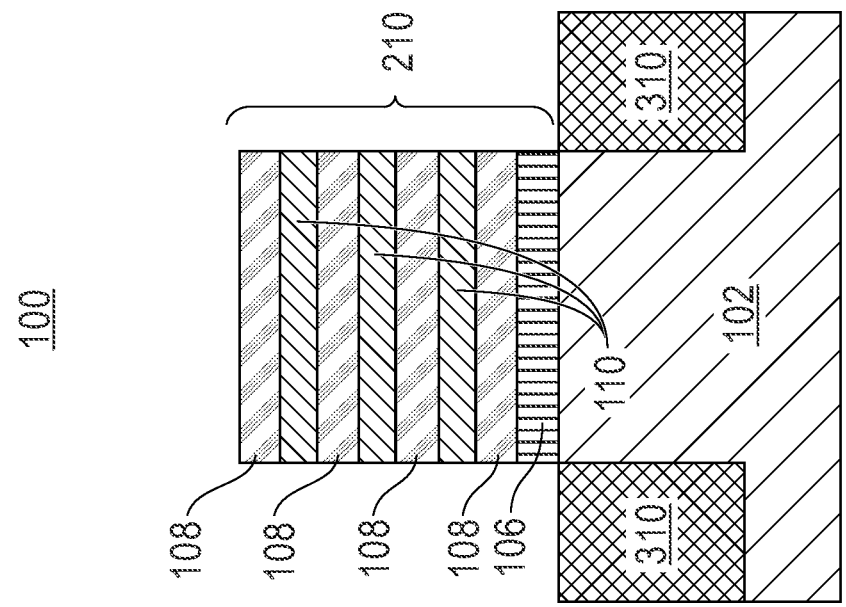
FIG. 4 is a cross-sectional view of the semiconductor structure taken along line B-B', as shown in FIG. 1, depicting forming shallow trench isolation regions, according to an embodiment of the present disclosure.

Referring now to FIG. 4, a cross-sectional view of the semiconductor structure 100 is shown after forming STI regions 310, according to an embodiment of the present disclosure. In this embodiment, FIG. 4 is a cross-sectional view of the semiconductor structure 100 taken along line B-B', as depicted in FIG. 1.

The process of forming the STI regions 310 is standard and well-known in the art, it typically involves depositing the insulating material to substantially fill areas of the semiconductor structure 100 between adjacent (not shown) nanosheet fins 210 for electrically isolating the nanosheet fin 210. The STI regions 310 may be formed by, for example, CVD of a dielectric material. Non-limiting examples of dielectric materials to form the STI regions 310 include silicon oxide, silicon nitride, hydrogenated silicon carbon oxide, silicon based low-k dielectrics, flowable oxides, porous dielectrics, or organic dielectrics including porous organic dielectrics. After forming the STI regions 310, the fin hardmask 202 can be removed from the semiconductor structure 100 using any suitable etching technique.

Figure 5:
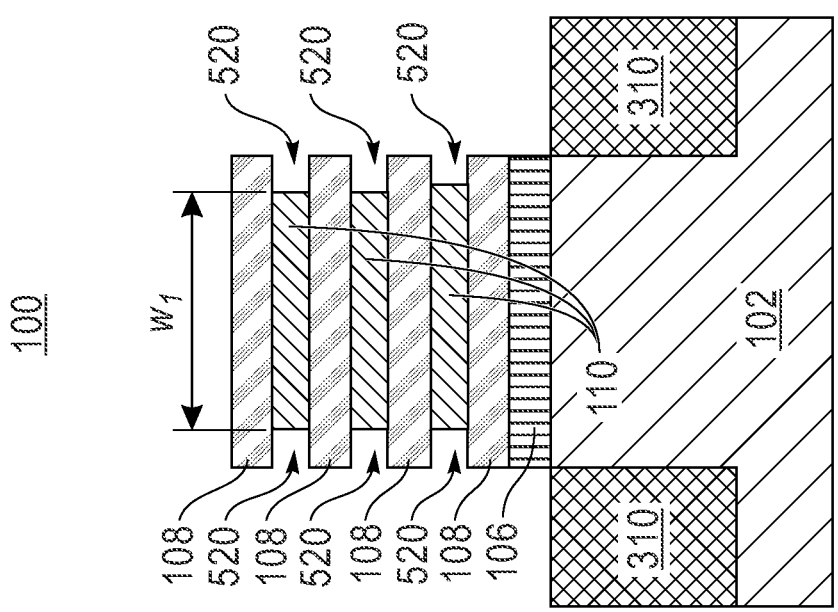
FIG. 5 is a cross-sectional view of the semiconductor structure taken along line B-B', as shown in FIG. 1, depicting selectively etching semiconductor channel layers, according to an embodiment of the present disclosure.

Referring now to FIG. 5, a cross-sectional view of the semiconductor structure 100 is shown after selectively etching the semiconductor channel layers 110, according to an embodiment of the present disclosure. In this embodiment, FIG. 5 is a cross-sectional view of the semiconductor structure 100 taken along line B-B', as depicted in FIG. 1.

As can be observed in the figure, the semiconductor channel layers 110 are laterally recessed using any suitable selective etching technique. In an exemplary embodiment, an isotropic etch process such as, for example, vapor phase $H_2/CF_4/Ar$ plasma can be performed on the semiconductor structure 100 to selectively recess the semiconductor channel layers 110. Preferably, the selected isotropic etch process is capable of etching the (Si) semiconductor channel layers 110 without attacking the (SiGe) sacrificial semiconductor layers 108.

Etching of the semiconductor channel layers 110 is conducted until approximately 3-10 nm of the semiconductor material (e.g., Si) forming the semiconductor channel layers 110 have been removed such that a length or horizontal width ($w_1$) of each of the semiconductor channel layers is less than a width of the sacrificial semiconductor layers 108 in the stack. Recessing the semiconductor channel layers 110 forms indentation regions 520 on opposite sides or ends of the semiconductor channel layers 110, as depicted in the figure. A conformal dielectric material can be subsequently deposited in the indentation regions 520 for protecting edges of the semiconductor channel layers 110. The subsequently deposited dielectric pinches-off the indentation regions 520 along the full length of the fins, as will be described below.

Figure 6A:
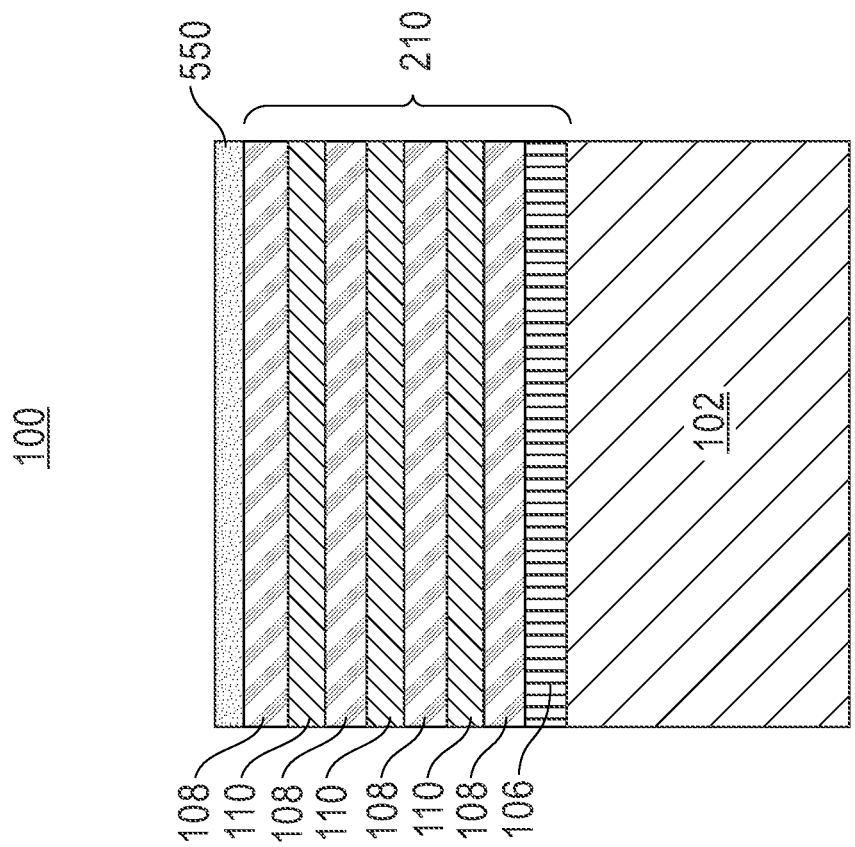
FIG. 6A is a cross-sectional view of the semiconductor structure taken along line A-A', as shown in FIG. 1, depicting forming a first dielectric layer, according to an embodiment of the present disclosure.

Referring now to FIGS. 6A-6C, cross-sectional views of the semiconductor structure 100 are shown after depositing a first dielectric layer 550, according to an embodiment of the present disclosure. In this embodiment, FIG. 6A is a cross-sectional view of the semiconductor structure 100 taken along line A-A', as depicted in FIG. 1; FIG. 6B is a cross-sectional view of the semiconductor structure 100 taken along line B-B', as depicted in FIG. 1; and FIG. 6C is a cross-sectional view of the semiconductor structure 100 taken along line C-C', as depicted in FIG. 1.

For ease of illustration and description of the present embodiments, all subsequent figures accompanied by the letter A are cross-sections taken along line A-A' (nanosheet fin region), as shown in FIG. 1; all subsequent figures accompanied by the letter B are cross-sections taken along line B-B' (gate region), as shown in FIG. 1; and all subsequent figures accompanied by the letter C are cross-sections taken along line C-C' (spacer region), as shown in FIG. 1.

According to an embodiment, the first dielectric layer 550 can be formed by conformal deposition of a dielectric material that pinches-off the indentation regions 520 (FIG. 5). Preferably, the dielectric material forming the first dielectric layer 550 includes, for instance, an oxide dielectric material deposited by atomic layer deposition (ALD), chemical vapor deposition (CVD), or any other suitable deposition processes. A thickness of the first dielectric layer 550 may vary from approximately 2 nm to approximately 6 nm, and ranges therebetween.

As can be appreciated in the figures, the first dielectric layer 550 deposits on exposed surfaces of the STI regions 310, nanosheet stack sacrificial layer 106, sacrificial semiconductor layers 108 and semiconductor channel layers 110 substantially filling the indentation regions 520 (FIG. 5).

Figure 7A:
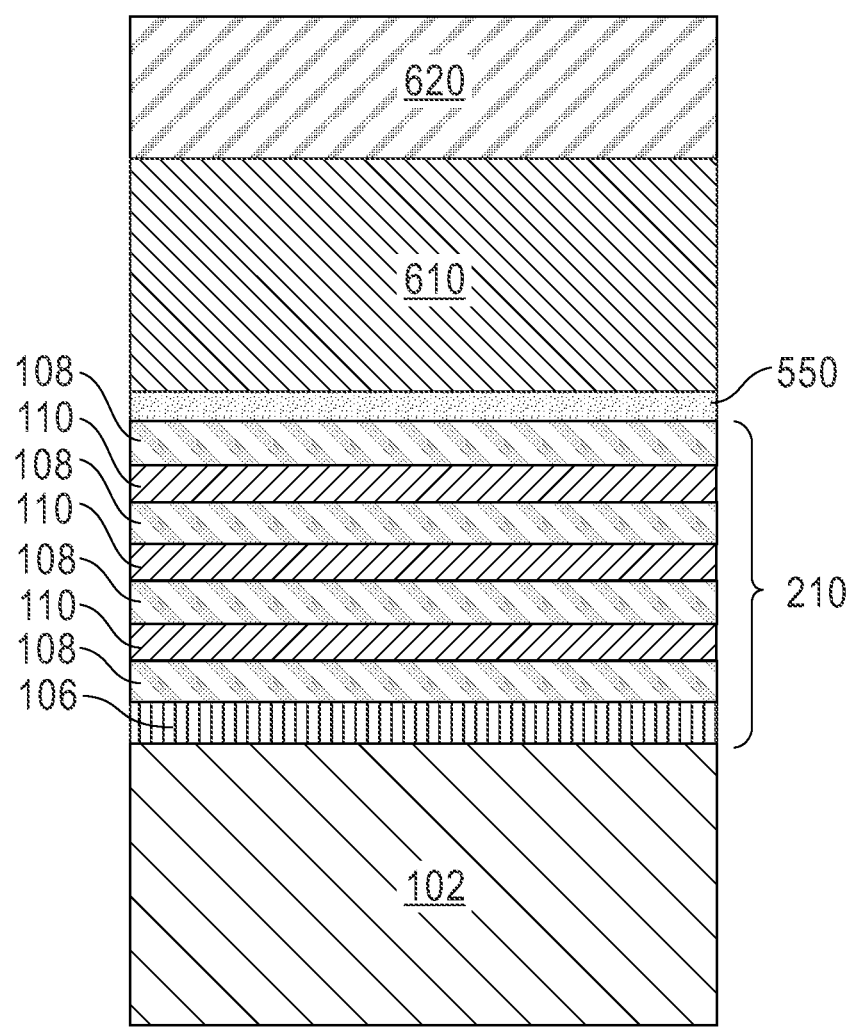
FIG. 7A is a cross-sectional view of the semiconductor structure taken along line A-A', as shown in FIG. 1, depicting forming a dummy gate and a sacrificial hardmask, according to an embodiment of the present disclosure.
Figure 7C:
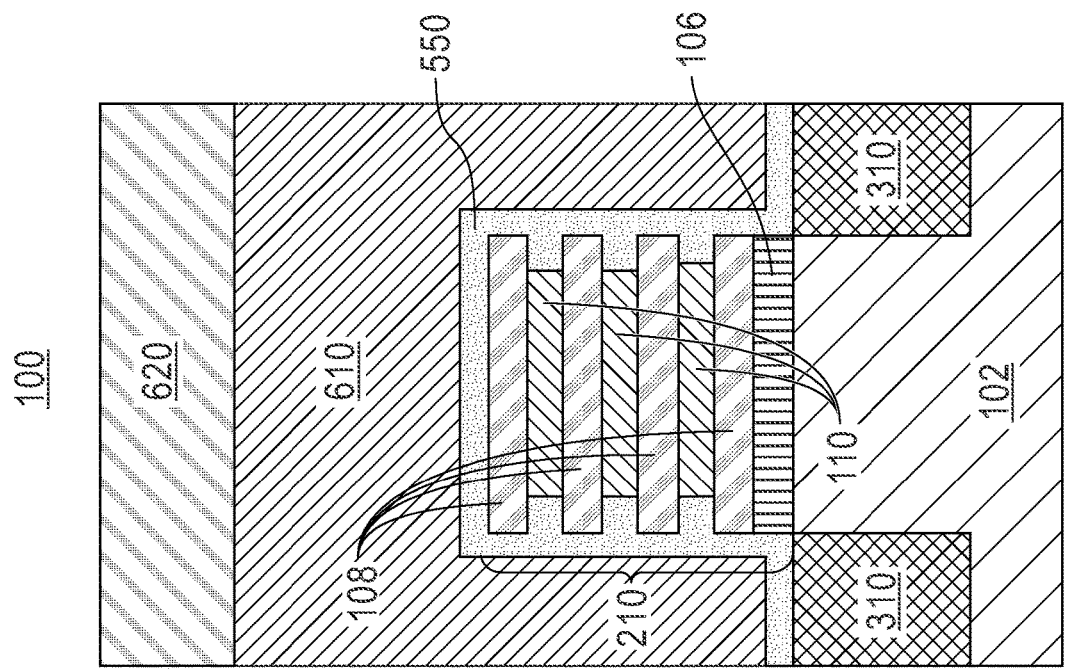
FIG. 7C is a cross-sectional view of the semiconductor structure 100 taken along line C-C', as shown in FIG. 1.
Figure 7B:
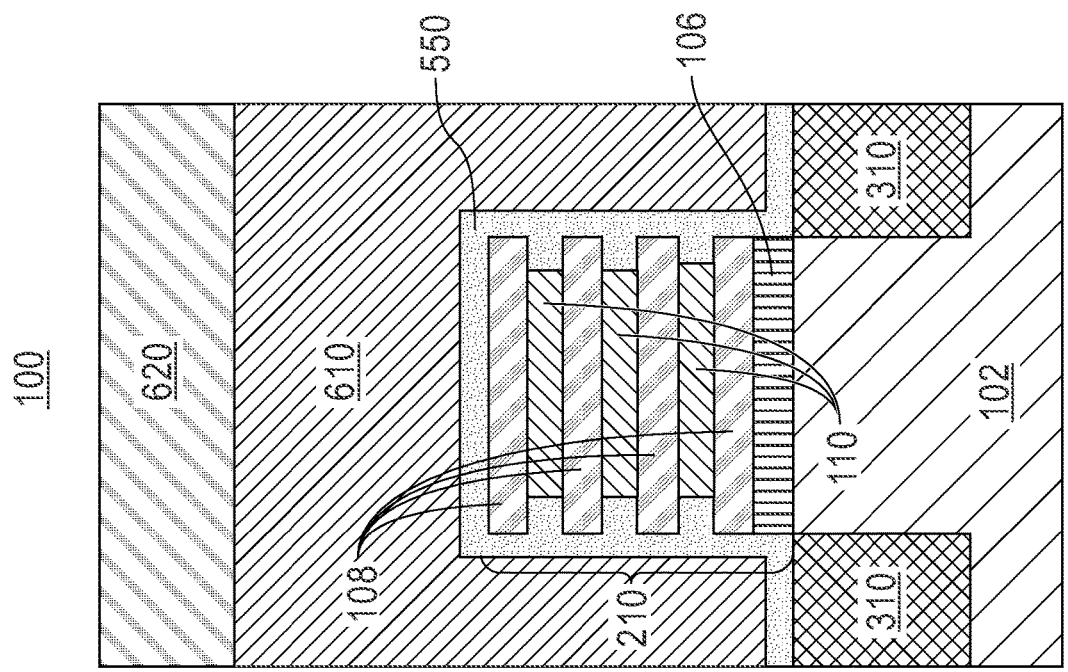
FIG. 7B is a cross-sectional view of the semiconductor structure taken along line B-B', as shown in FIG. 1.

Referring now to FIGS. 7A-7C, cross-sectional views of the semiconductor structure 100 are shown after depositing a sacrificial hardmask 620 and a dummy gate 610, according to an embodiment of the present disclosure. In this embodiment, FIG. 7A is a cross-sectional view of the semiconductor structure 100 taken along line A-A', as depicted in FIG. 1; FIG. 7B is a cross-sectional view of the semiconductor structure 100 taken along line B-B', as depicted in FIG. 1; and FIG. 7C is a cross-sectional view of the semiconductor structure 100 taken along line C-C', as depicted in FIG. 1.

The sacrificial hardmask 620 and dummy gate 610 form a sacrificial gate structure for the semiconductor structure 100. The dummy gate 610 is formed above, and in direct contact with, the first dielectric layer 550, while the sacrificial hardmask 620 is formed above the dummy gate 610. The process of forming the dummy gate 610 and sacrificial hardmask 620 is typical and well-known in the art. In one or more embodiments, the dummy gate 610 is formed from amorphous silicon (a-Si), and the sacrificial hardmask 620 is formed from silicon nitride (SiN), silicon oxide, an oxide/nitride stack, or similar materials and configurations.

Figure 8A:
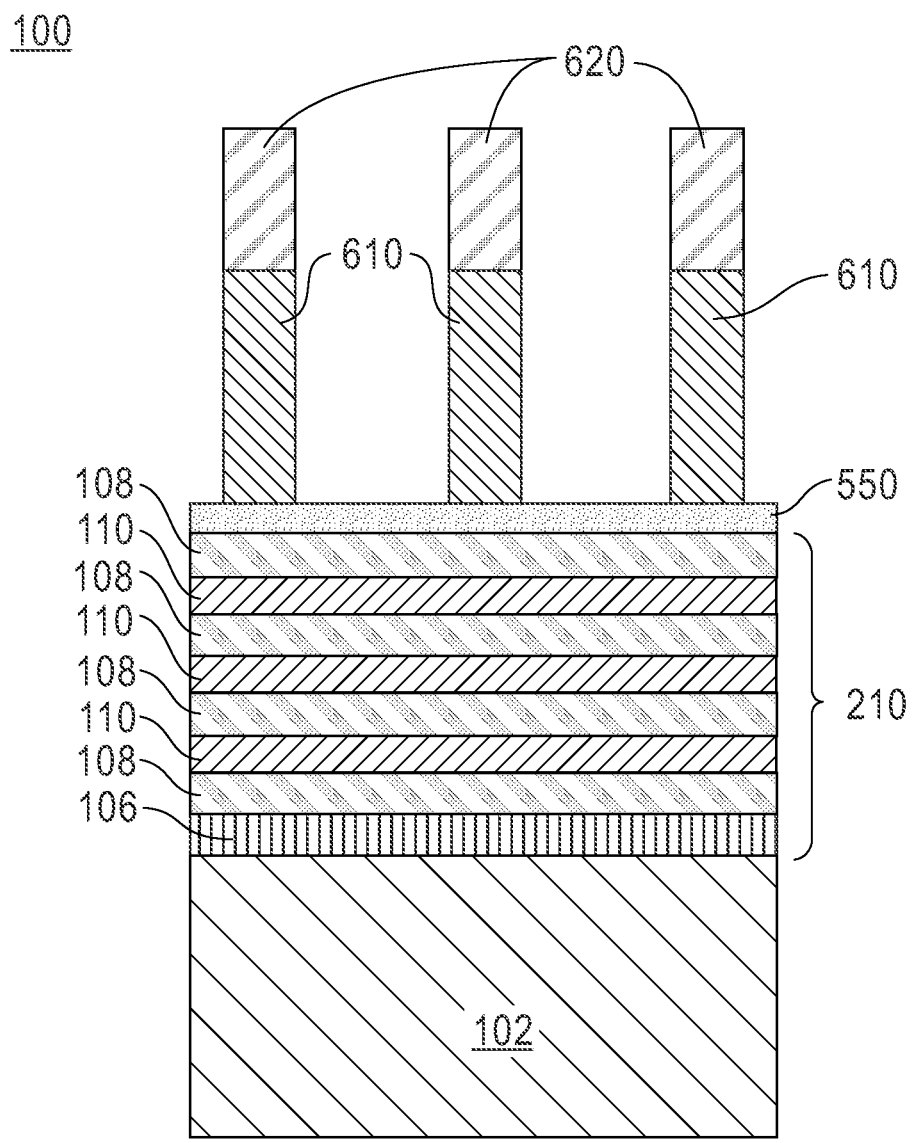
FIG. 8A is a cross-sectional view of the semiconductor structure taken along line A-A', as shown in FIG. 1, depicting patterning the dummy gate, according to an embodiment of the present disclosure.
Figure 8C:
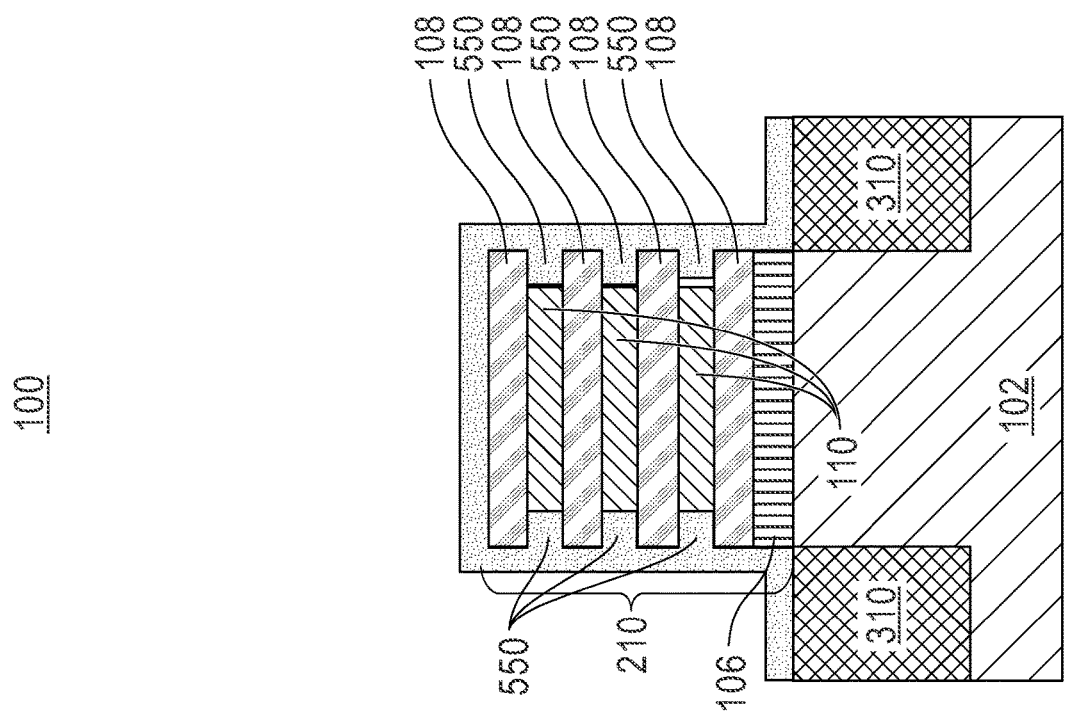
FIG. 8C is a cross-sectional view of the semiconductor structure 100 taken along line C-C', as shown in FIG. 1.
Figure 8B:
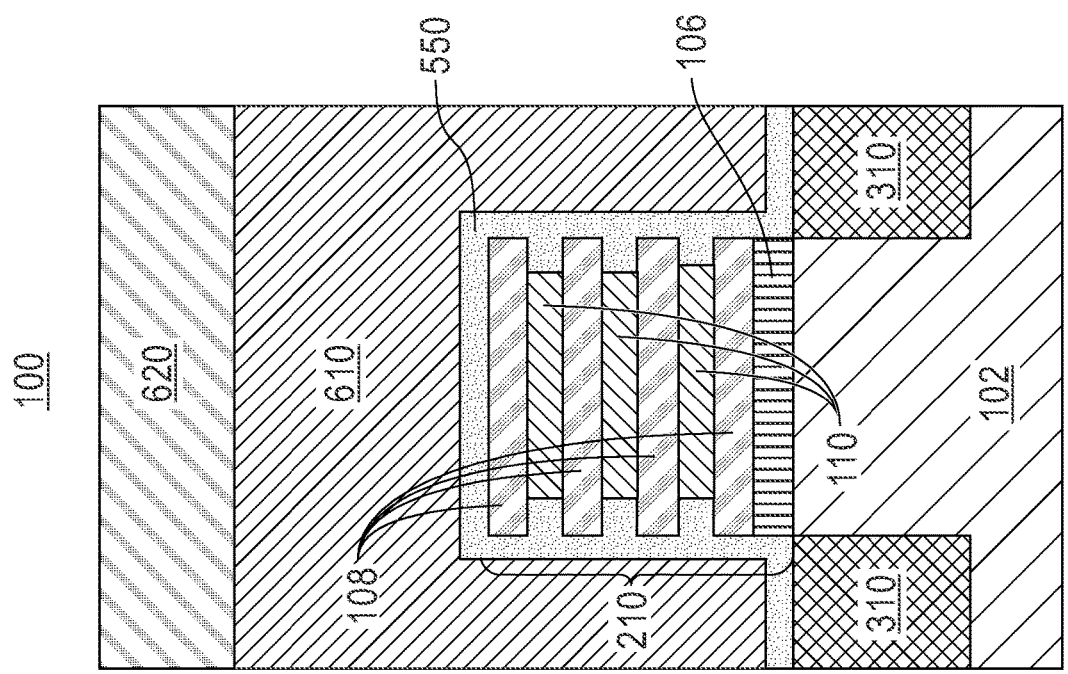
FIG. 8B is a cross-sectional view of the semiconductor structure taken along line B-B', as shown in FIG. 1.

Referring now to FIGS. 8A-8C, cross-sectional views of the semiconductor structure 100 are shown after patterning the dummy gate 610, according to an embodiment of the present disclosure. In this embodiment, FIG. 8A is a cross-sectional view of the semiconductor structure 100 taken along line A-A', as depicted in FIG. 1; FIG. 8B is a cross-sectional view of the semiconductor structure 100 taken along line B-B', as depicted in FIG. 1; and FIG. 8C is a cross-sectional view of the semiconductor structure 100 taken along line C-C', as depicted in FIG. 1.

As known by those skilled in the art, the process of patterning the dummy gate 610 typically involves exposing a pattern on a photoresist layer and transferring the pattern to the sacrificial hardmask 620 and dummy gate 610 using known lithography and RIE processing, as shown in FIG. 8A. The dummy gate 610 is formed and patterned over the first dielectric layer 550 located on a top surface and along sidewalls of the nanosheet fin 210. As depicted in FIG. 8A, patterning of the dummy gate 610 exposes portions of the first dielectric layer 550 located between sacrificial gate structures. As mentioned above, the cross-sectional view of FIG. 8C is taken along line C-C' as depicted in FIG. 1, which represents a cut along a sidewall spacer region adjacent to the gate region, thus FIG. 8C does not show the sacrificial gate structure formed by the dummy gate 610 and sacrificial hardmask 620.

Figure 9A:
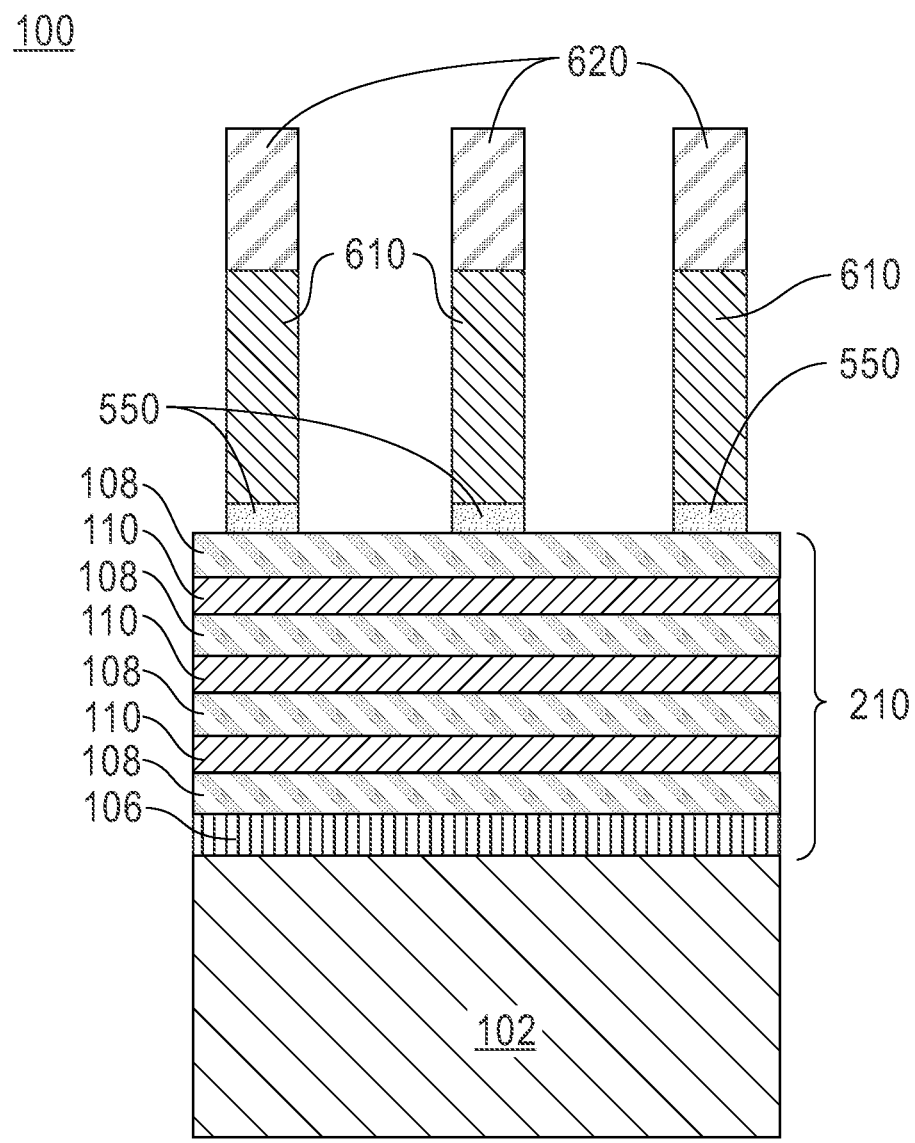
FIG. 9A is a cross-sectional view of the semiconductor structure taken along line A-A', as shown in FIG. 1, depicting etching portions of a sacrificial dielectric layer, according to an embodiment of the present disclosure.
Figure 9C:
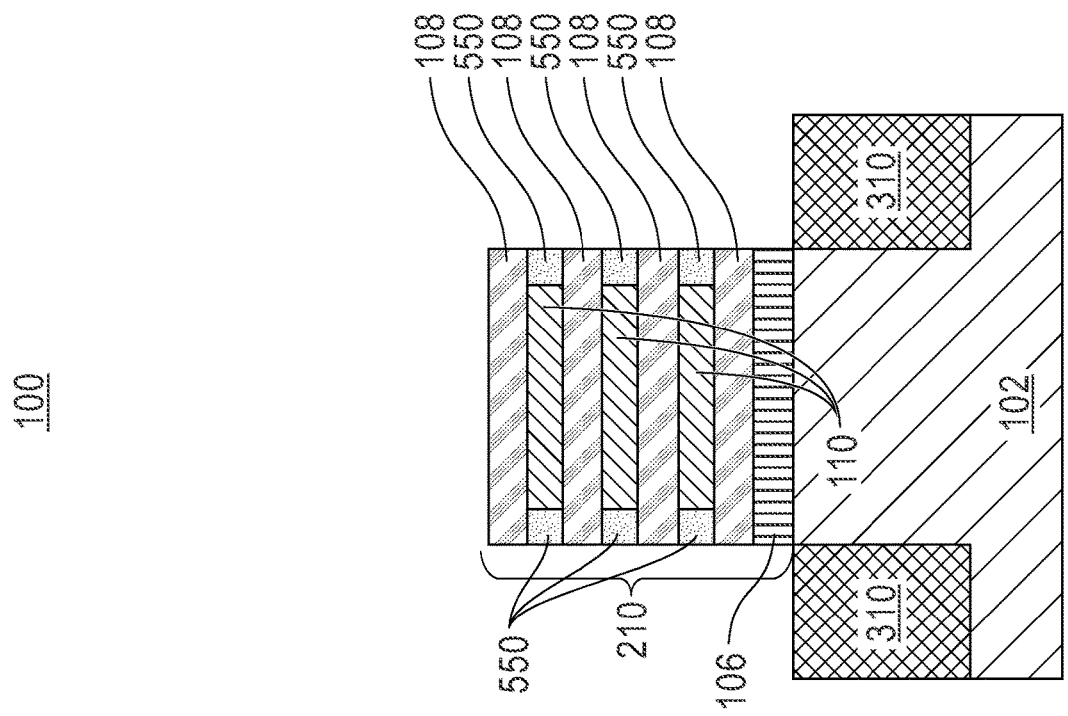
FIG. 9C is a cross-sectional view of the semiconductor structure 100 taken along line C-C', as shown in FIG. 1.
Figure 9B:
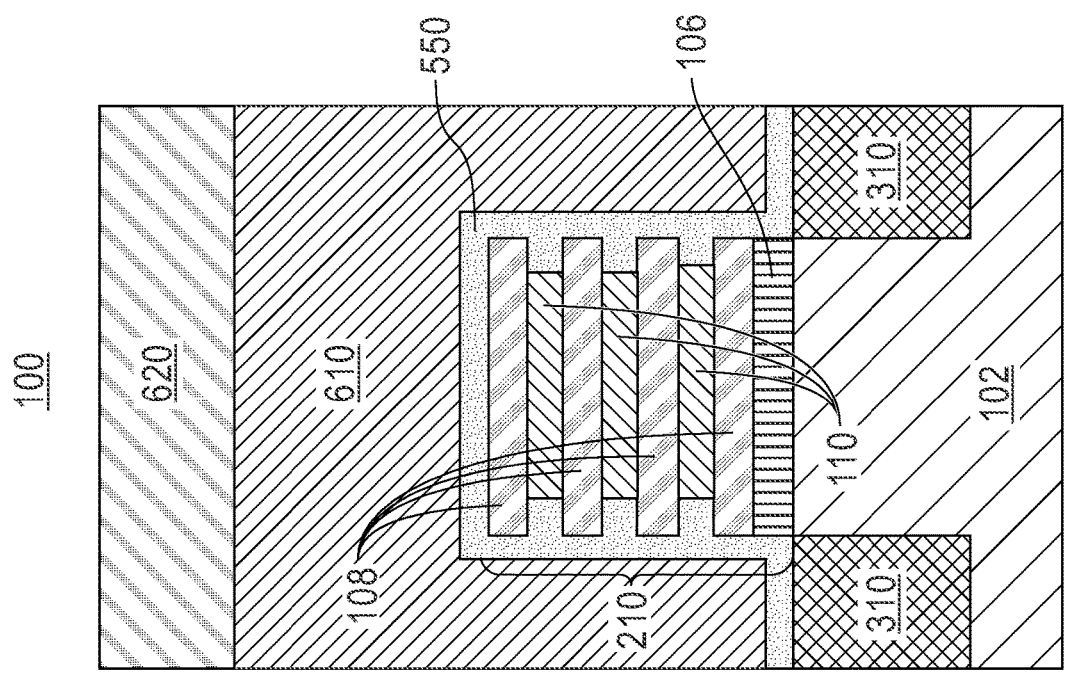
FIG. 9B is a cross-sectional view of the semiconductor structure taken along line B-B', as shown in FIG. 1.

Referring now to FIGS. 9A-9C, cross-sectional views of the semiconductor structure 100 are shown after etching portions of the first dielectric layer 550, according to an embodiment of the present disclosure. In this embodiment, FIG. 9A is a cross-sectional view of the semiconductor structure 100 taken along line A-A', as depicted in FIG. 1; FIG. 9B is a cross-sectional view of the semiconductor structure 100 taken along line B-B', as depicted in FIG. 1; and FIG. 9C is a cross-sectional view of the semiconductor structure 100 taken along line C-C', as depicted in FIG. 1.

In this step, portions of the first dielectric layer 550 exposed after patterning the dummy gate 610 (FIGS. 8A-8C) are removed using, for example, a diluted hydrofluoric acid (DHF) clean. Removing the exposed portions of the first dielectric layer 550 uncovers a top surface and sidewalls of the uppermost sacrificial semiconductor layer 108 of the nanosheet fin 210 and opposite sidewalls of remaining sacrificial semiconductor layers 108, as depicted in FIGS. 9A and 9C, respectively. Thus, the first dielectric layer 550 remains on opposite sidewalls of the semiconductor channel layers 110 protecting the edges of the semiconductor channel layers 110 on the gate and spacer regions (FIGS. 9B and 9C).

Figure 10A:
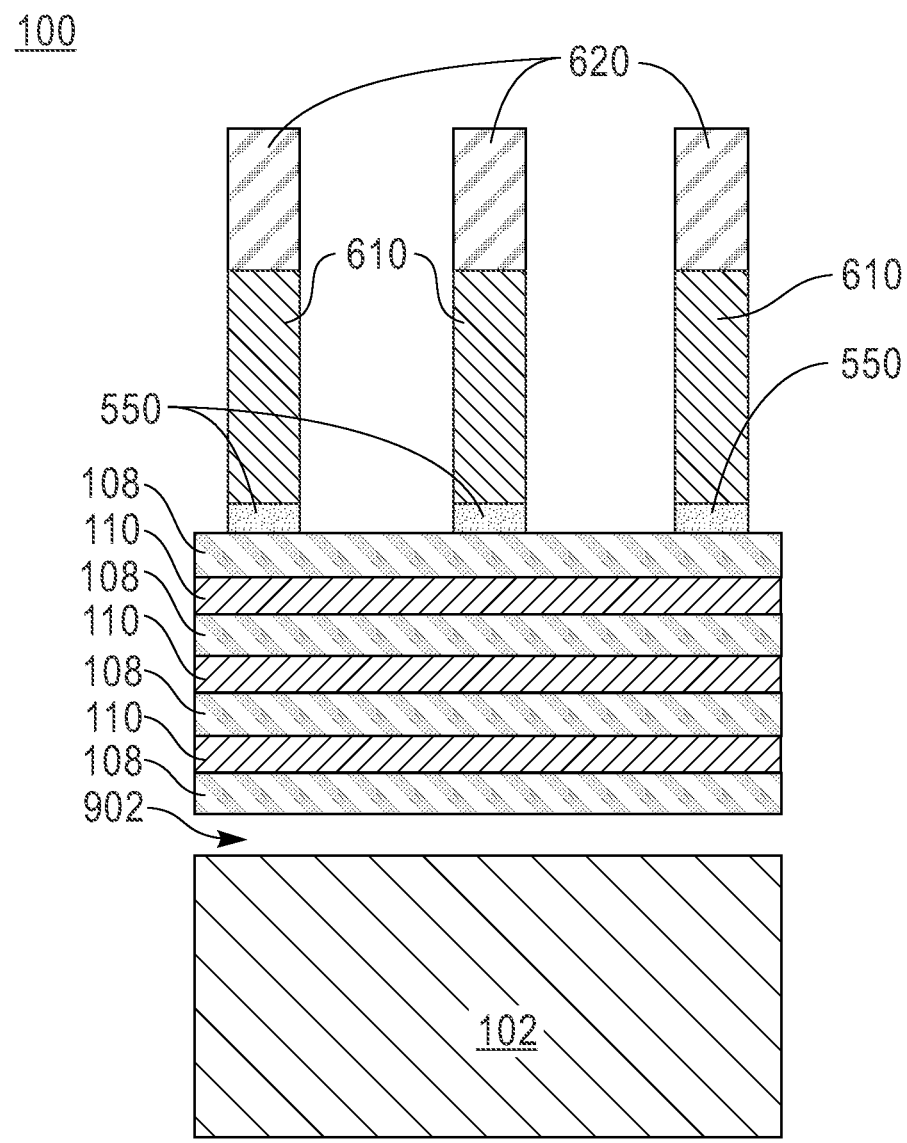
FIG. 10A is a cross-sectional view of the semiconductor structure taken along line A-A', as shown in FIG. 1, depicting removing a nanosheet stack sacrificial layer, according to an embodiment of the present disclosure.
Figure 10B:
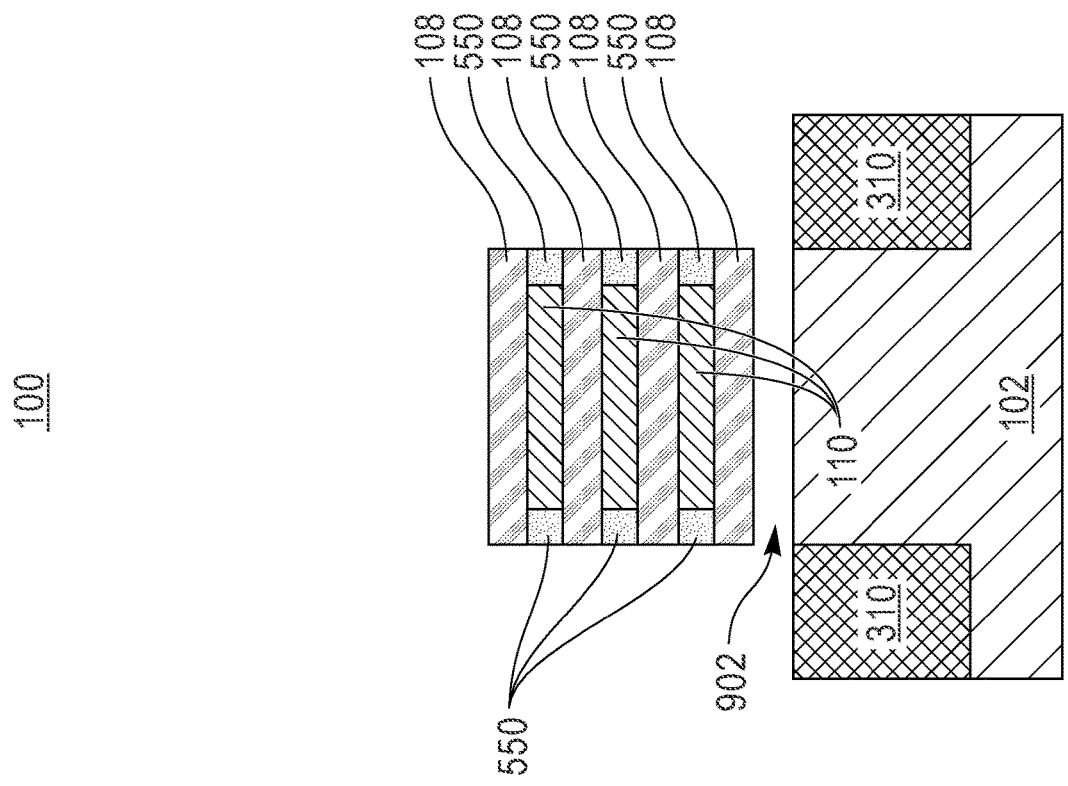
FIG. 10B is a cross-sectional view of the semiconductor structure taken along line B-B', as shown in FIG. 1.
Figure 10C:
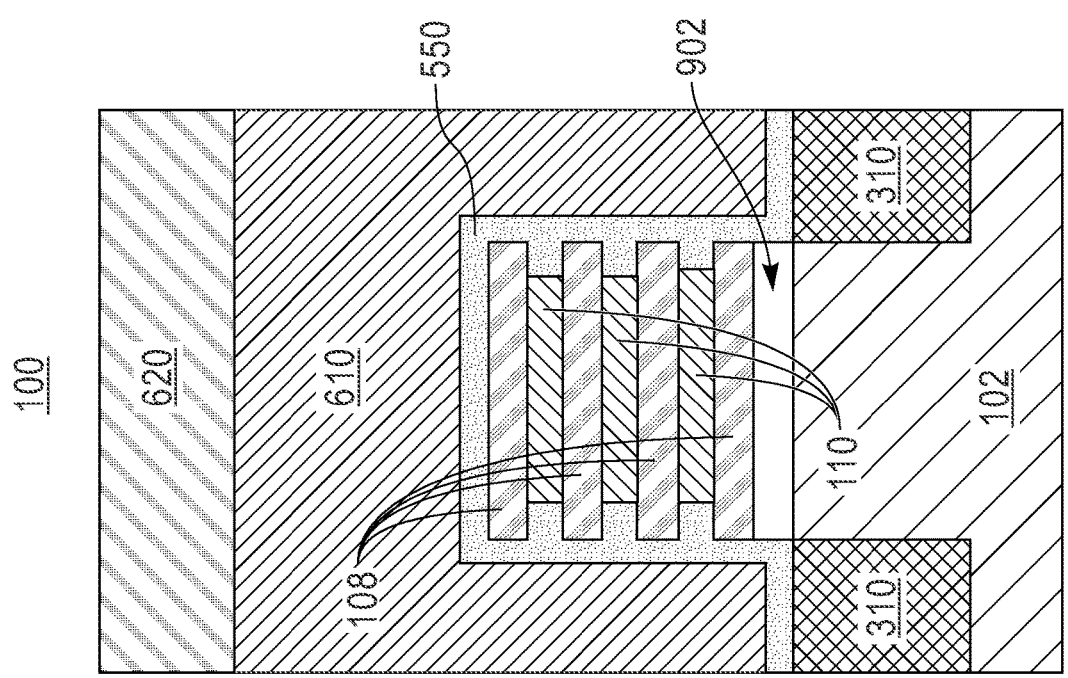
FIG. 10C is a cross-sectional view of the semiconductor structure 100 taken along line C-C', as shown in FIG. 1.

Referring now to FIGS. 10A-10C, cross-sectional views of the semiconductor structure 100 are shown after removing the nanosheet stack sacrificial layer 106 (FIGS. 9A-9C), according to an embodiment of the present disclosure. In this embodiment, FIG. 10A is a cross-sectional view of the semiconductor structure 100 taken along line A-A', as depicted in FIG. 1; FIG. 10B is a cross-sectional view of the semiconductor structure 100 taken along line B-B', as depicted in FIG. 1; and FIG. 10C is a cross-sectional view of the semiconductor structure 100 taken along line C-C', as depicted in FIG. 1.

As depicted in the figures, removal of the nanosheet stack sacrificial layer 106 (FIGS. 9A-9C) creates an opening 902 in the semiconductor structure 100, in the area from which the nanosheet stack sacrificial layer 106 was removed. According to an embodiment, the nanosheet stack sacrificial layer 106 is removed selective to the semiconductor substrate 102, the sacrificial semiconductor layers 108, the semiconductor channel layers 110, the dummy gate 610 and the sacrificial hardmask 620. For example, a highly selective dry etch process can be used to selectively remove the nanosheet stack sacrificial layer 106 (FIGS. 9A-9C).

Figure 11A:
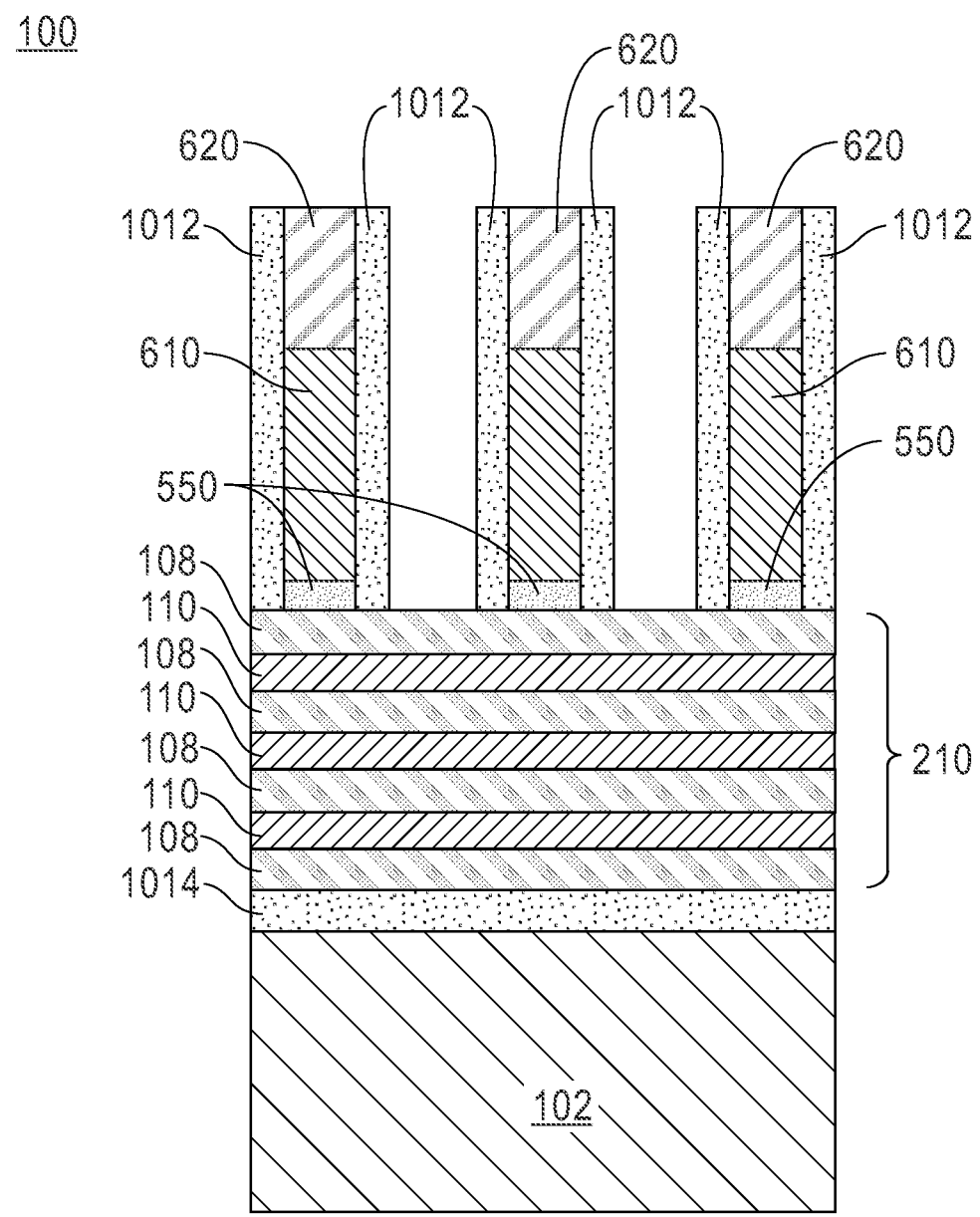
FIG. 11A is a cross-sectional view of the semiconductor structure taken along line A-A', as shown in FIG. 1, depicting forming a sidewall spacer, according to an embodiment of the present disclosure.
Figure 11C:
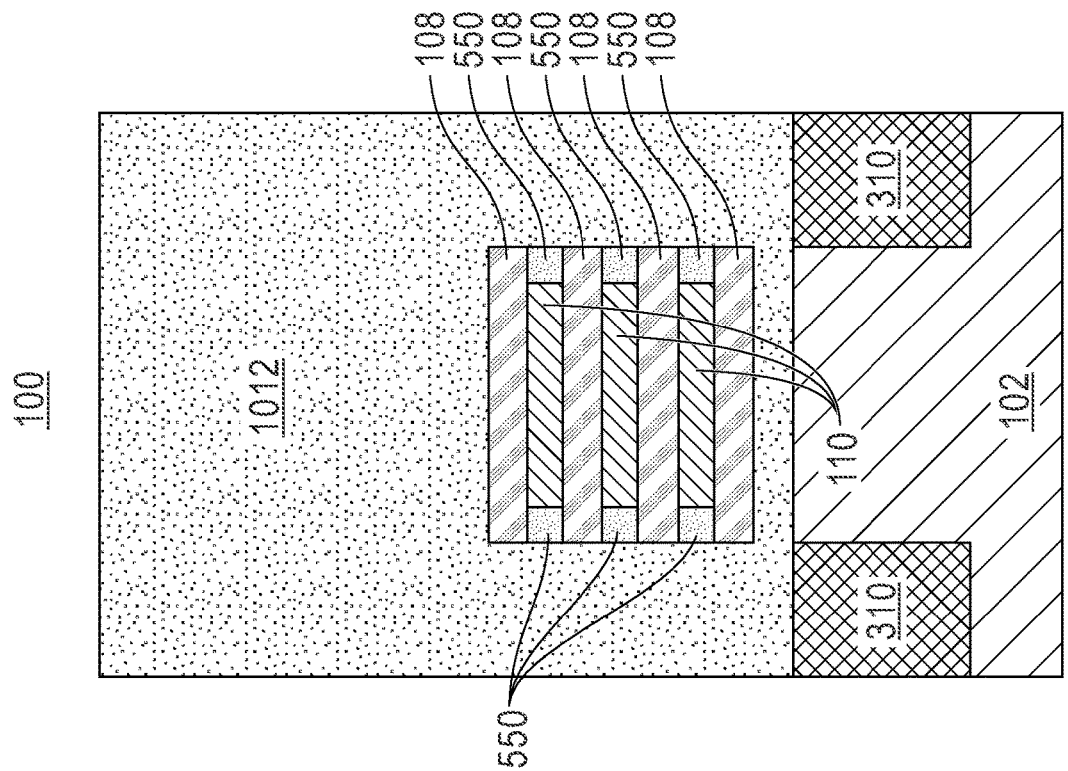
FIG. 11C is a cross-sectional view of the semiconductor structure 100 taken along line C-C', as shown in FIG. 1.
Figure 11B:
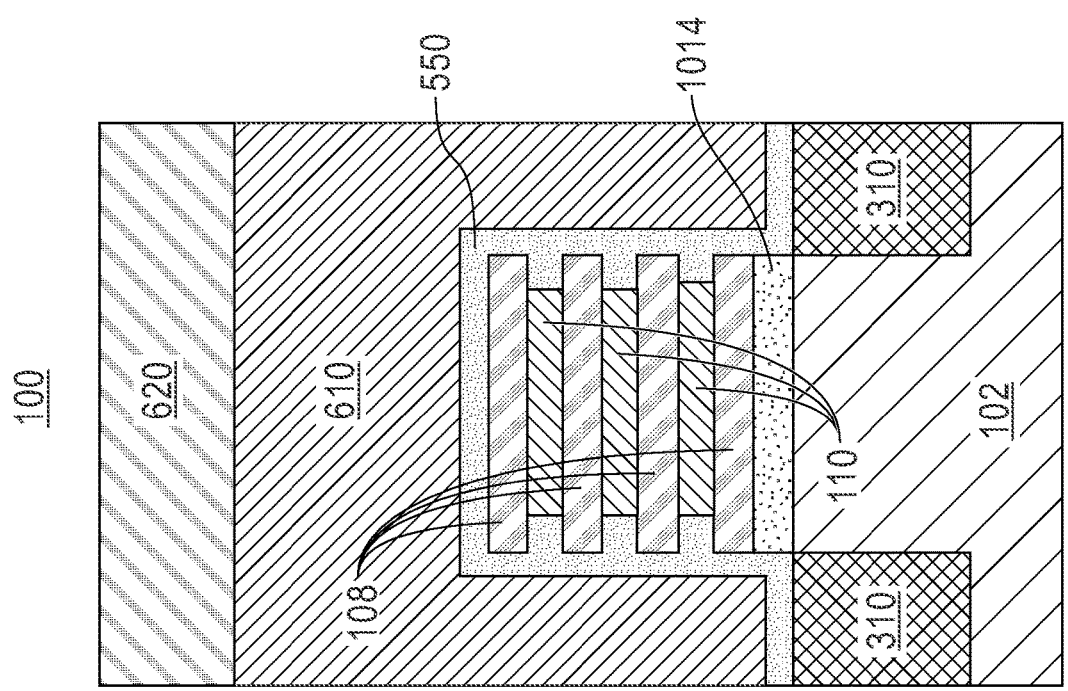
FIG. 11B is a cross-sectional view of the semiconductor structure taken along line B-B', as shown in FIG. 1.

Referring now to FIGS. 11A-11C, cross-sectional views of the semiconductor structure 100 are shown after forming a sidewall spacer 1012, according to an embodiment of the present disclosure. In this embodiment, FIG. 11A is a cross-sectional view of the semiconductor structure 100 taken along line A-A', as depicted in FIG. 1; FIG. 11B is a cross-sectional view of the semiconductor structure 100 taken along line B-B', as depicted in FIG. 1; and FIG. 11C is a cross-sectional view of the semiconductor structure 100 taken along line C-C', as depicted in FIG. 1.

In this embodiment, a spacer material has been deposited along sidewalls of the dummy gate 610, along sidewalls of the sacrificial hardmask 620 and along sidewalls of the first dielectric layer 550 to form the sidewall spacer 1012, as depicted in FIG. 11A. The spacer material forming the sidewall spacer 1012 substantially fills the opening 902 shown in FIGS. 10A-10C. The sidewall spacer 1012 can be formed using a spacer pull down formation process. The sidewall spacer 1012 can also be formed using a sidewall image transfer (SIT) spacer formation process, which includes spacer material deposition followed by directional RIE of the deposited spacer material.

Generally, the spacer material deposited between the nanosheet fin 210 and the semiconductor substrate 102 can be referred to as a bottom dielectric isolation layer 1014. In some embodiments, the bottom dielectric isolation layer 1014 and the sidewall spacer 1012 may be composed of different materials.

Non-limiting examples of various spacer materials for forming the sidewall spacer 1012 and the bottom dielectric isolation layer 1014 may include conventional low-K materials such as $SiO_2$, SiOC, SiOCN, or SiBCN. Typically, a thickness of the sidewall spacer 1012 may vary from approximately 5 nm to approximately 20 nm, and ranges therebetween.

Figure 12A:
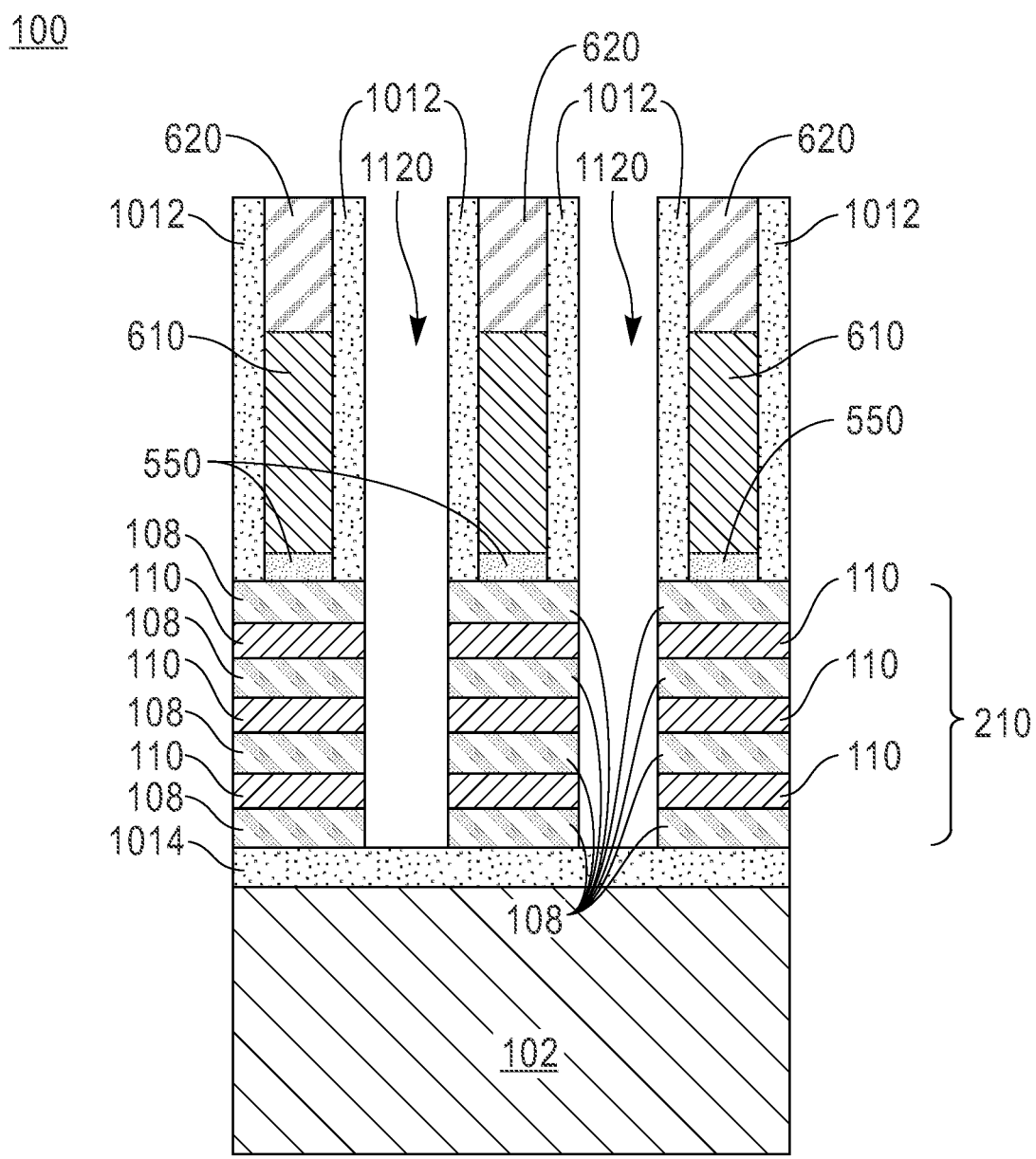
FIG. 12A is a cross-sectional view of the semiconductor structure taken along line A-A', as shown in FIG. 1, depicting recessing the nanosheet fin, according to an embodiment of the present disclosure.
Figure 12C:
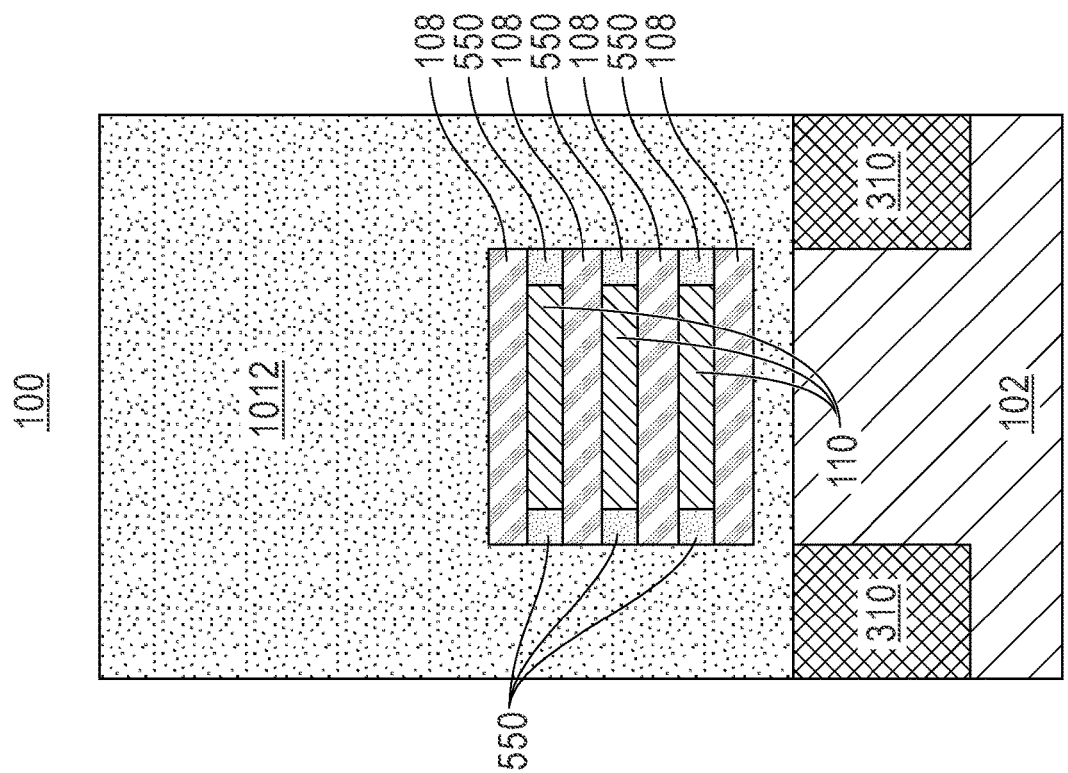
FIG. 12C is a cross-sectional view of the semiconductor structure 100 taken along line C-C', as shown in FIG. 1.
Figure 12B:
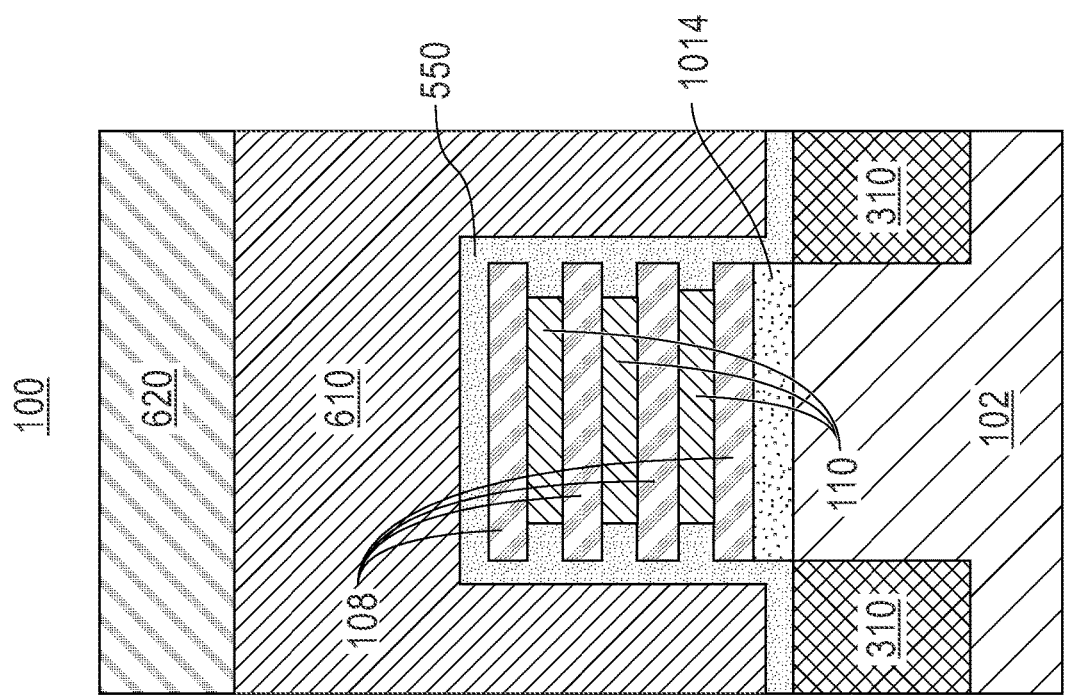
FIG. 12B is a cross-sectional view of the semiconductor structure taken along line B-B', as shown in FIG. 1.

Referring now to FIGS. 12A-12C, cross-sectional views of the semiconductor structure 100 are shown after recessing the nanosheet fin 210, according to an embodiment of the present disclosure. In this embodiment, FIG. 12A is a cross-sectional view of the semiconductor structure 100 taken along line A-A', as depicted in FIG. 1; FIG. 12B is a cross-sectional view of the semiconductor structure 100 taken along line B-B', as depicted in FIG. 1; and FIG. 12C is a cross-sectional view of the semiconductor structure 100 taken along line C-C', as depicted in FIG. 1.

As known by those skilled in the art, the sidewall spacer 1012 can be used as a mask, to recess portions of the nanosheet fin 210 that are not covered by the sidewall spacer 1012 and dummy gate 610, as illustrated in the figure. For example, a RIE process can be used to recess the portions of the nanosheet fin 210 that are not under the sidewalls spacer 1012 and dummy gate 610. According to an embodiment, the nanosheet fin 210 can be recessed until an uppermost surface of the bottom dielectric isolation layer 1014 to form trenches (or source/drain recesses) 1120.

Figure 13A:
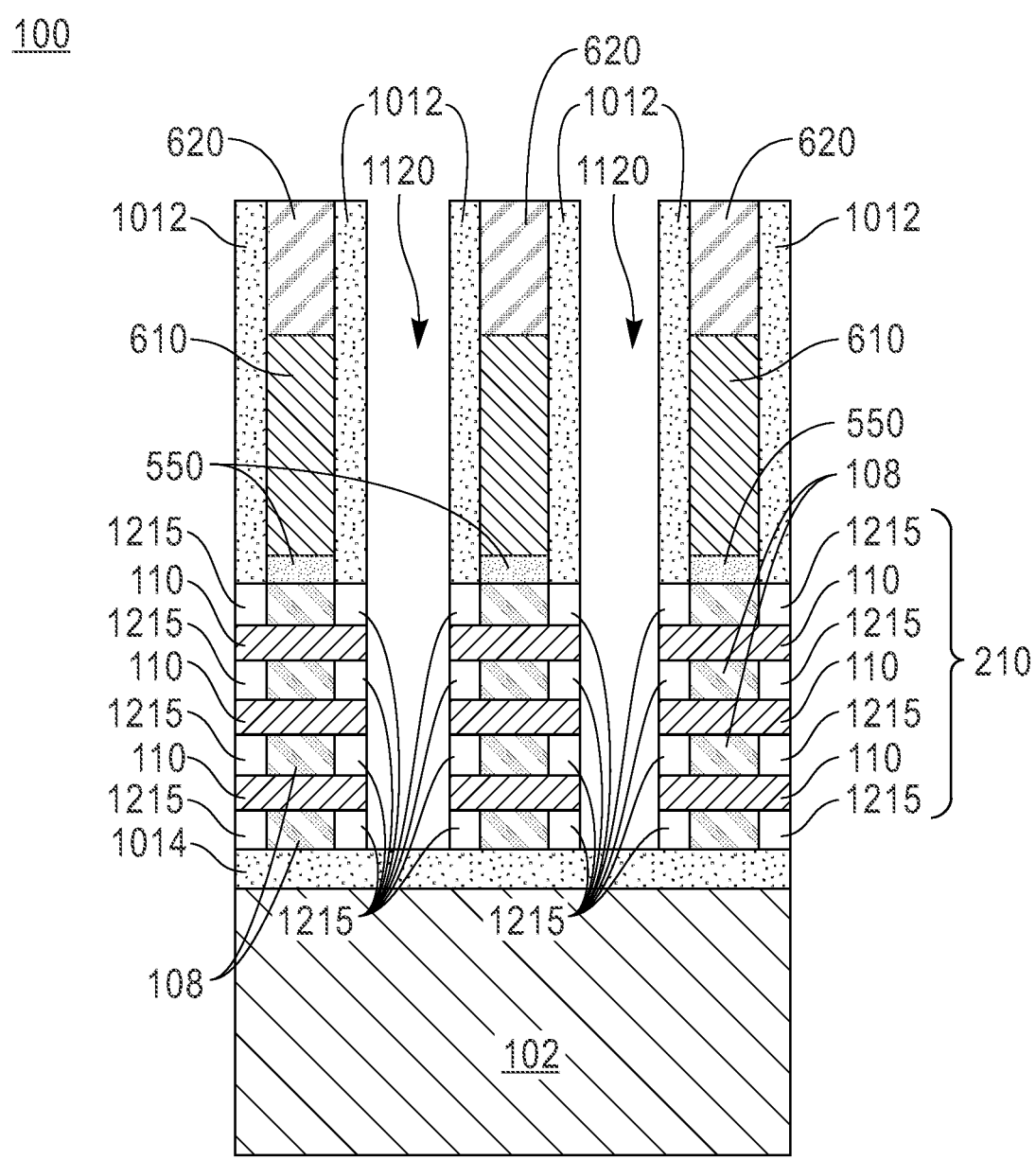
FIG. 13A is a cross-sectional view of the semiconductor structure taken along line A-A', as shown in FIG. 1, depicting forming inner spacers, according to an embodiment of the present disclosure.

Referring now to FIGS. 13A-13C, cross-sectional views of the semiconductor structure 100 are shown after forming inner spacers 1215, according to an embodiment of the present disclosure. In this embodiment, FIG. 13A is a cross-sectional view of the semiconductor structure 100 taken along line A-A', as depicted in FIG. 1; FIG. 13B is a cross-sectional view of the semiconductor structure 100 taken along line B-B', as depicted in FIG. 1; and FIG. 13C is a cross-sectional view of the semiconductor structure 100 taken along line C-C', as depicted in FIG. 1.

In this embodiment, outer portions of each of the sacrificial semiconductor layers 108 are selectively recessed using, for example, a selective etch process such as a hydrogen chloride (HCL) gas etch. Preferably, the selected etch process for recessing the sacrificial semiconductor layers 108 is capable of etching silicon germanium without attacking silicon. The inner spacers 1215 may be formed within an indented cavity (not shown) formed after etching the sacrificial semiconductor layers 108. The inner spacers 1215 can be formed, for example, by conformal deposition of an inner spacer dielectric material that pinches off the indented cavity (not shown) formed after recessing of the sacrificial semiconductor layers 108. The inner spacers 1215 may include any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100.

As depicted in FIG. 13A, outer sidewalls of the inner spacers 1215 are vertically aligned with the semiconductor channel layers 110, and thus with upper portions of the sidewall spacer 1012 located on opposing sidewalls of the dummy gate 610.

Figure 14A:
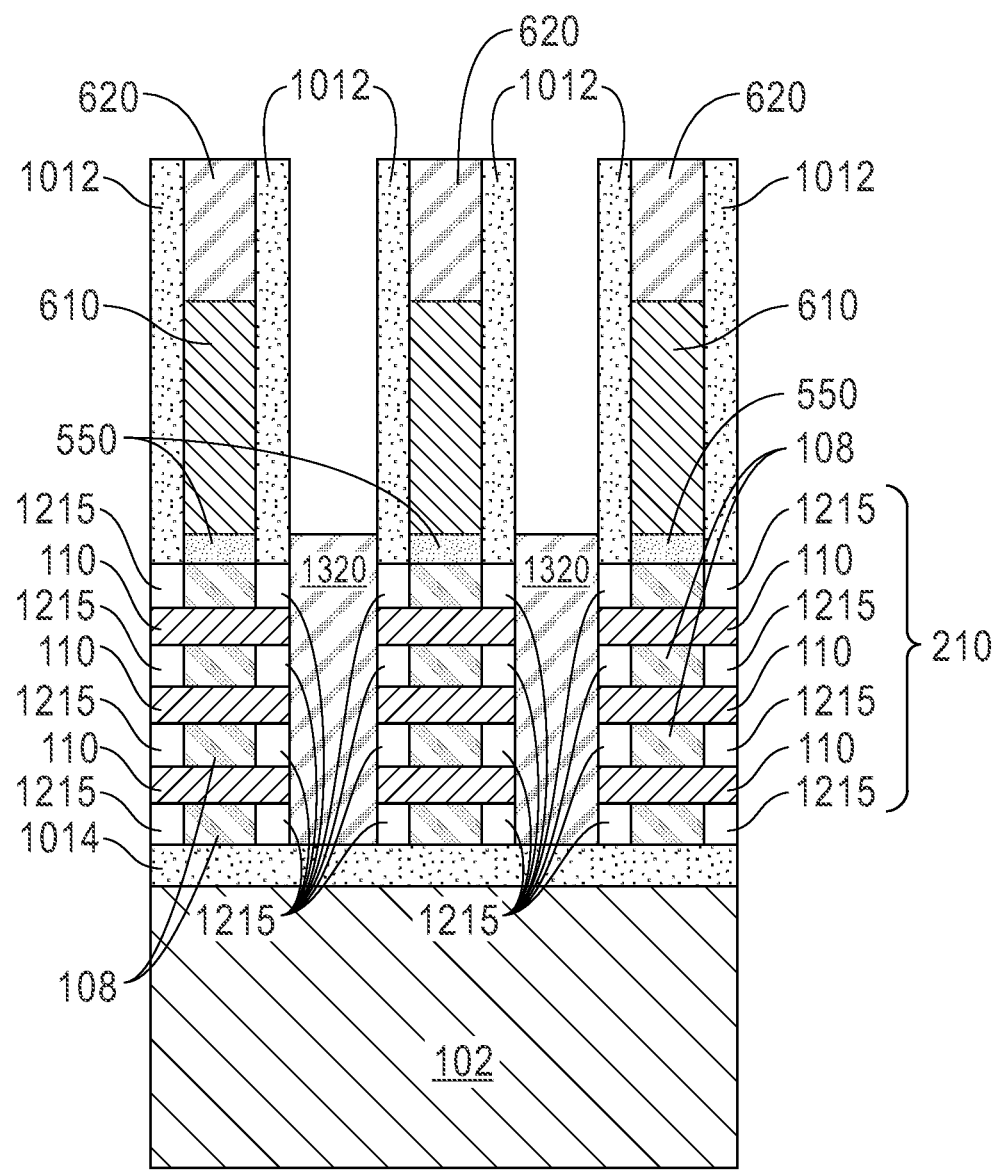
FIG. 14A is a cross-sectional view of the semiconductor structure taken along line A-A', as shown in FIG. 1, depicting forming source/drain regions, according to an embodiment of the present disclosure.
Figure 14C:
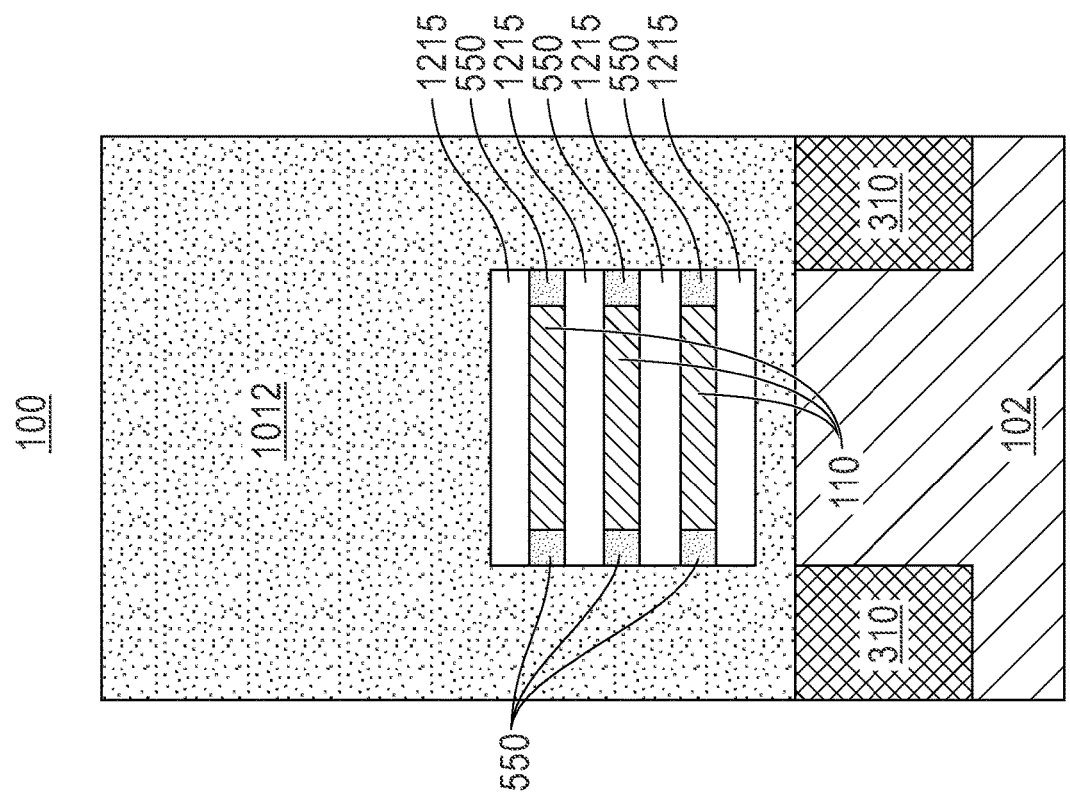
FIG. 14C is a cross-sectional view of the semiconductor structure 100 taken along line C-C', as shown in FIG. 1.
Figure 14B:
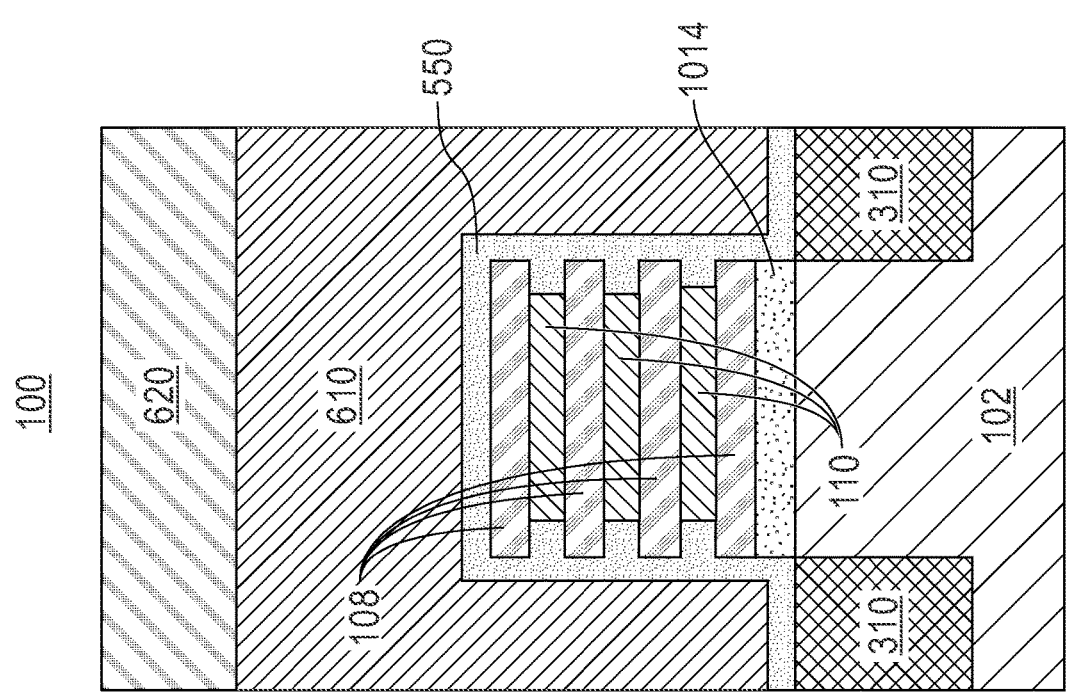
FIG. 14B is a cross-sectional view of the semiconductor structure taken along line B-B', as shown in FIG. 1.

Referring now to FIGS. 14A-14C, cross-sectional views of the semiconductor structure 100 are shown after forming source/drain regions 1320, according to an embodiment of the present disclosure. In this embodiment, FIG. 14A is a cross-sectional view of the semiconductor structure 100 taken along line A-A', as depicted in FIG. 1; FIG. 14B is a cross-sectional view of the semiconductor structure 100 taken along line B-B', as depicted in FIG. 1; and FIG. 14C is a cross-sectional view of the semiconductor structure 100 taken along line C-C', as depicted in FIG. 1.

After forming the inner spacers 1215, source/drain regions 1320 can be formed on the trenches or source/drain recesses 1120 shown in FIG. 13A. The source/drain regions 1320 can be formed using an epitaxial layer growth process on the exposed ends of the semiconductor channel layers 110.

As depicted in FIG. 14A, the source/drain regions 1320 are formed on opposing sides of the nanosheet fins 210 in direct contact with end portions of the semiconductor channel layers 110 and end portions of the inner spacers 1215 surrounding the sacrificial semiconductor layers 108. The source/drain regions 1320 are located above the bottom dielectric isolation layer 1014 formed above the semiconductor substrate 102. Thus, the bottom dielectric isolation layer 1014 may isolate the source/drain regions 1320, thereby preventing epitaxial growth from the semiconductor substrate 102.

Figure 15A:
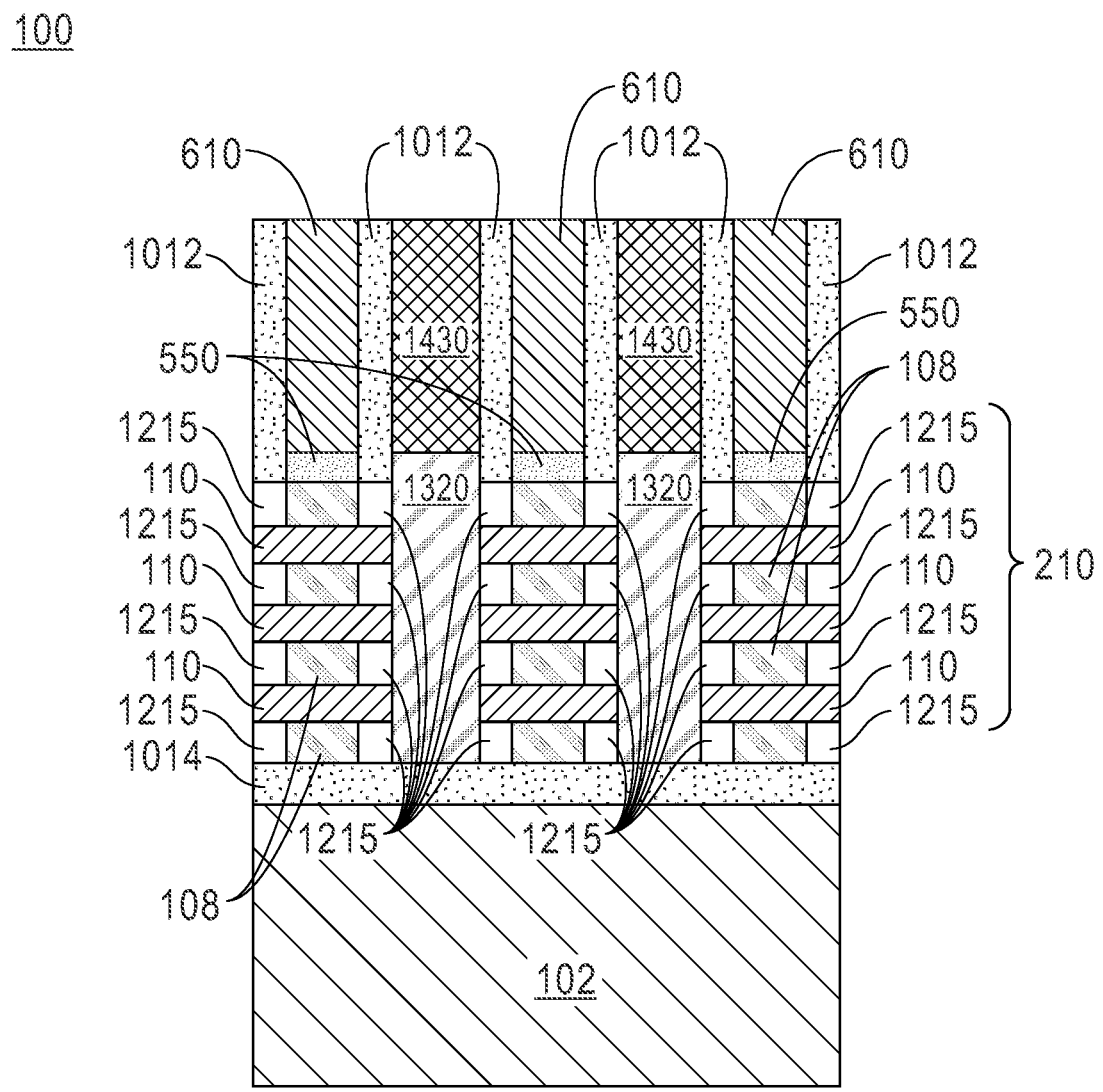
FIG. 15A is a cross-sectional view of the semiconductor structure taken along line A-A', as shown in FIG. 1, depicting forming a second dielectric layer, according to an embodiment of the present disclosure.

Referring now to FIGS. 15A-15C, cross-sectional views of the semiconductor structure 100 are shown after forming a second dielectric layer 1430, according to an embodiment of the present disclosure. In this embodiment, FIG. 15A is a cross-sectional view of the semiconductor structure 100 taken along line A-A', as depicted in FIG. 1; FIG. 15B is a cross-sectional view of the semiconductor structure 100 taken along line B-B', as depicted in FIG. 1; and FIG. 15C is a cross-sectional view of the semiconductor structure 100 taken along line C-C', as depicted in FIG. 1.

At this step of the manufacturing process, a second dielectric layer 1430 is formed to fill voids in the semiconductor structure 100. Specifically, the second dielectric layer 1430 fills a space remaining above the source/drain regions 1320. The second dielectric layer 1430 can be formed by, for example, CVD of a dielectric material. Non-limiting examples of dielectric materials to form the second dielectric layer 1430 may include silicon oxide, silicon nitride, hydrogenated silicon carbon oxide, silicon based low-k dielectrics, flowable oxides, porous dielectrics, or organic dielectrics including porous organic dielectrics.

After deposition of the second dielectric layer 1430, a planarization process, such as a chemical mechanical polishing (CMP), can be conducted on the semiconductor structure 100. This process may expose a top surface of the dummy gate 610 in preparation for removal of the dummy gate 610 (i.e., gate replacement).

Figure 16A:
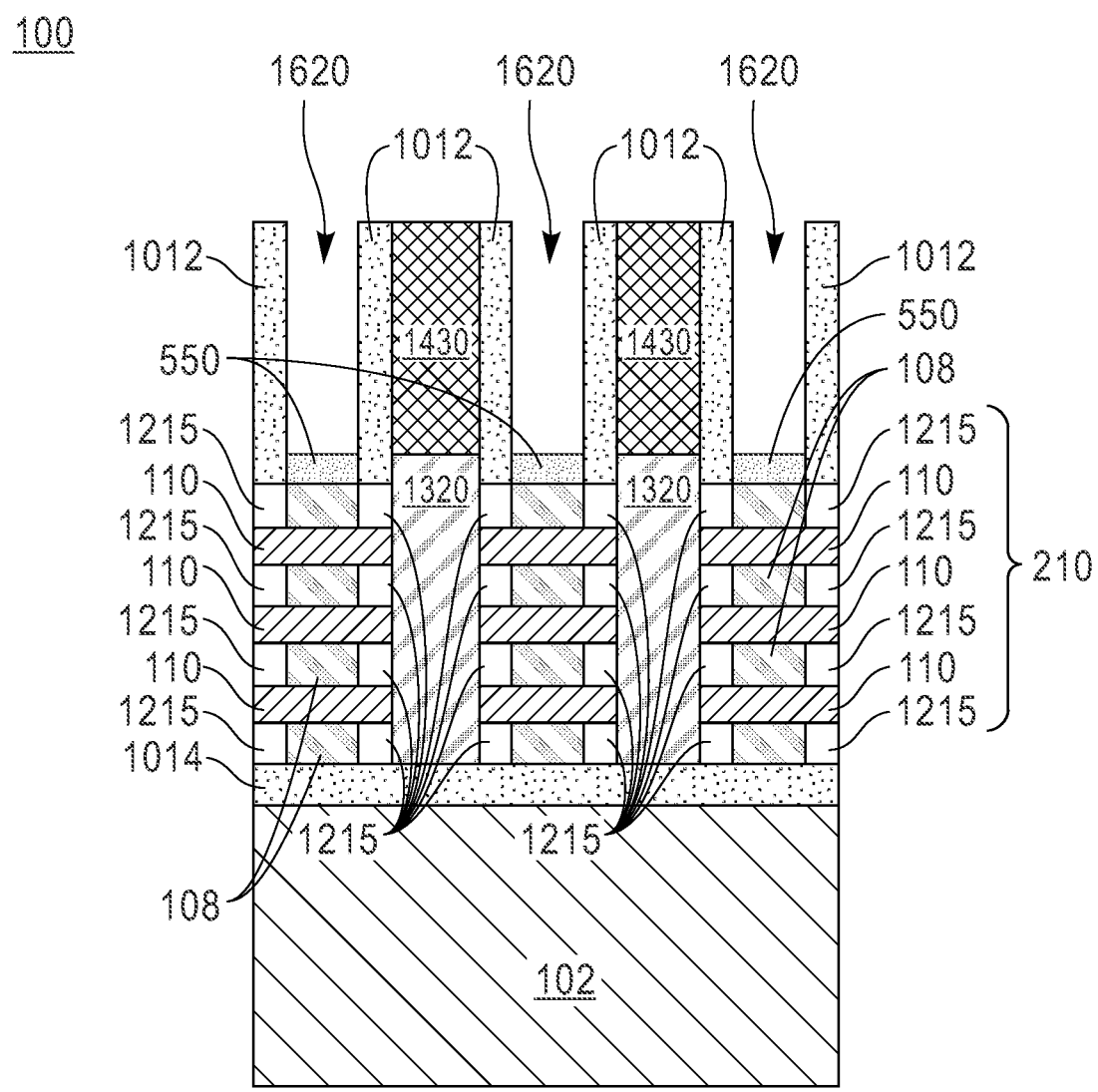
FIG. 16A is a cross-sectional view of the semiconductor structure taken along line A-A', as shown in FIG. 1, depicting removing the dummy gate, according to an embodiment of the present disclosure.
Figures 16B, 16C:
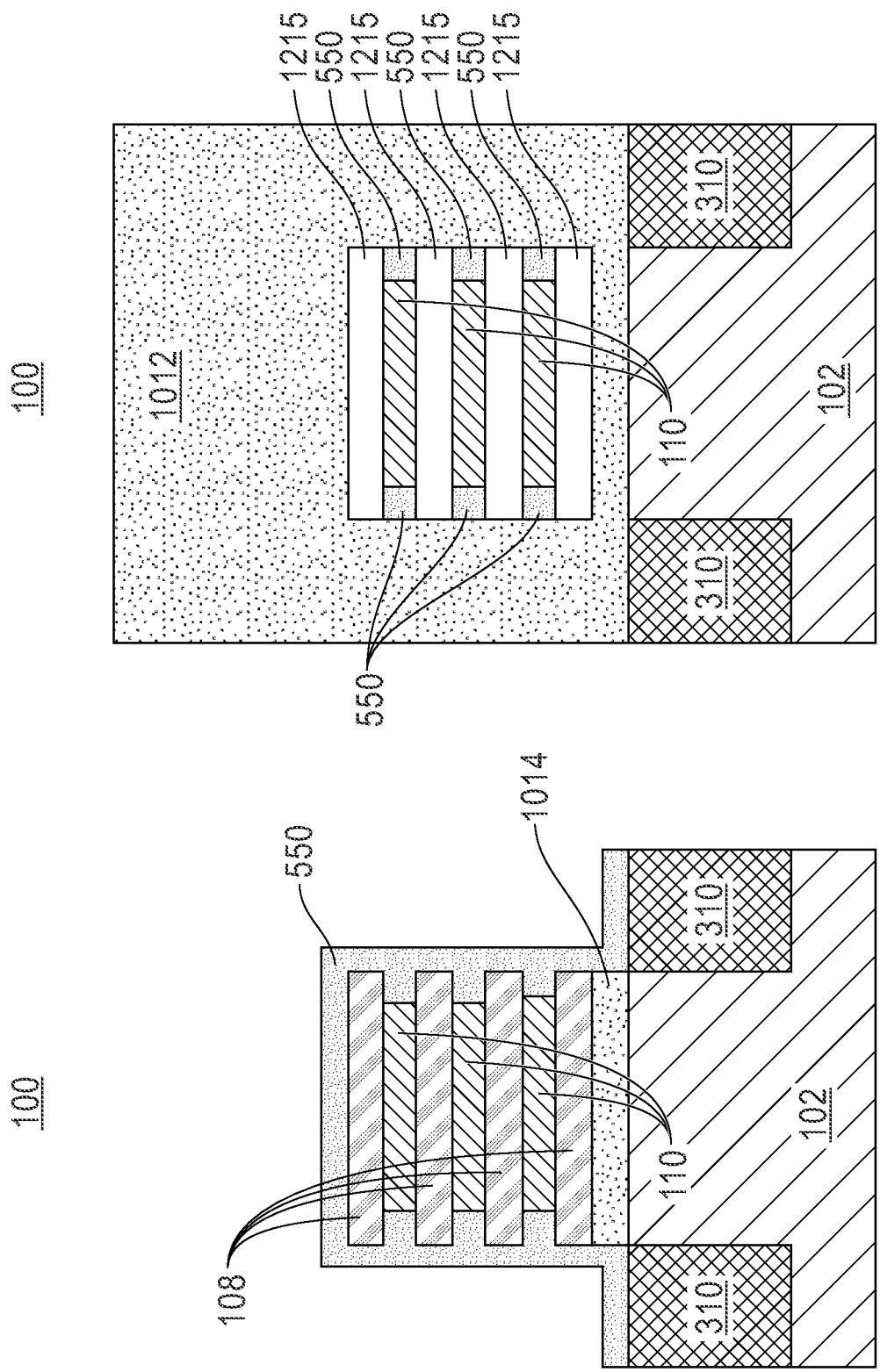
FIG. 16B is a cross-sectional view of the semiconductor structure taken along line B-B', as shown in FIG. 1.
FIG. 16C is a cross-sectional view of the semiconductor structure 100 taken along line C-C', as shown in FIG. 1.

Referring now to FIGS. 16A-16C, cross-sectional views of the semiconductor structure 100 are shown after removal of the dummy gate 610 (FIG. 15A), according to an embodiment of the present disclosure. In this embodiment, FIG. 16A is a cross-sectional view of the semiconductor structure 100 taken along line A-A', as depicted in FIG. 1; FIG. 16B is a cross-sectional view of the semiconductor structure 100 taken along line B-B', as depicted in FIG. 1; and FIG. 16C is a cross-sectional view of the semiconductor structure 100 taken along line C-C', as depicted in FIG. 1.

The dummy gate 610 (FIGS. 15A-15B) can be removed using known etching processes including, for example, RIE or chemical oxide removal (COR). In a gate-last fabrication process, the removed dummy gate 610 (FIGS. 15A-15B) is thereafter replaced with a metal gate as known in the art. First recesses 1620 remains on the semiconductor structure 100 after removal of the dummy gate 610 (FIGS. 15A-15B). As illustrated in the figure, the first recess 1620 expose the first dielectric layer 550 located on and around the nanosheet fin 210.

Figure 17A:
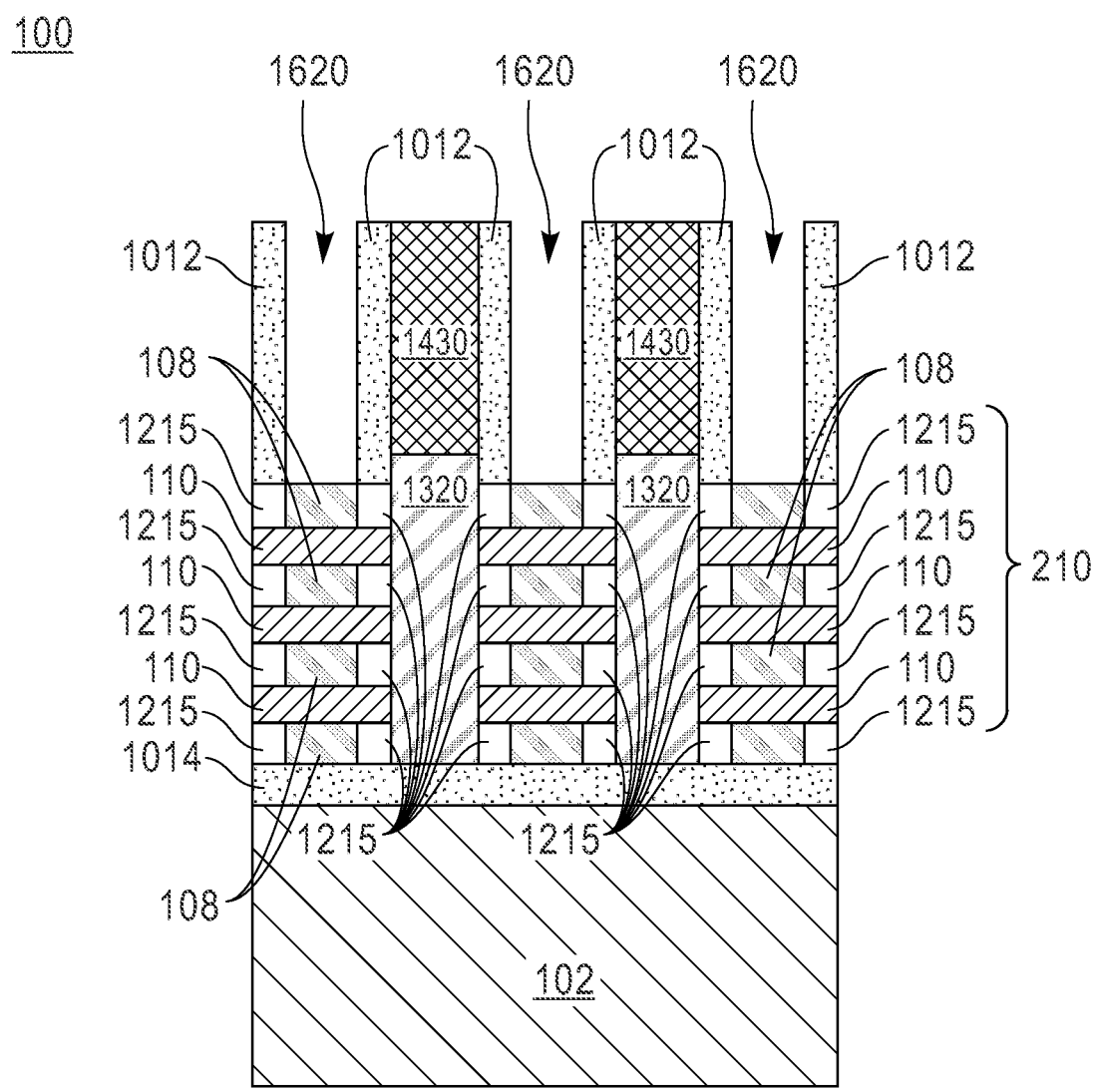
FIG. 17A is a cross-sectional view of the semiconductor structure taken along line A-A', as shown in FIG. 1, depicting etching the first dielectric layer, according to an embodiment of the present disclosure.

Referring now to FIGS. 17A-17C, cross-sectional views of the semiconductor structure 100 are shown after etching the first dielectric layer 550, according to an embodiment of the present disclosure. In this embodiment, FIG. 17A is a cross-sectional view of the semiconductor structure 100 taken along line A-A', as depicted in FIG. 1; FIG. 17B is a cross-sectional view of the semiconductor structure 100 taken along line B-B', as depicted in FIG. 1; and FIG. 17C is a cross-sectional view of the semiconductor structure 100 taken along line C-C', as depicted in FIG. 1.

In this embodiment, a selective etch process is conducted on the semiconductor structure 100 to remove first portions of the first dielectric layer 550 located in contact with the sacrificial semiconductor layers 108. Second portions of the first dielectric layer 550 remain in contact with opposite ends of the silicon channel layers 110 between sacrificial semiconductor layers 108 in the gate region (FIG. 17B) and third portions of the first dielectric layer 550 remain in contact with opposite ends of the semiconductor channel layers 110 between inner spacers 1215 in the spacer region. The remaining second and third portions of the first dielectric layer 550 may protect the silicon channel layers 110 during subsequent processing steps.

Figure 18A:
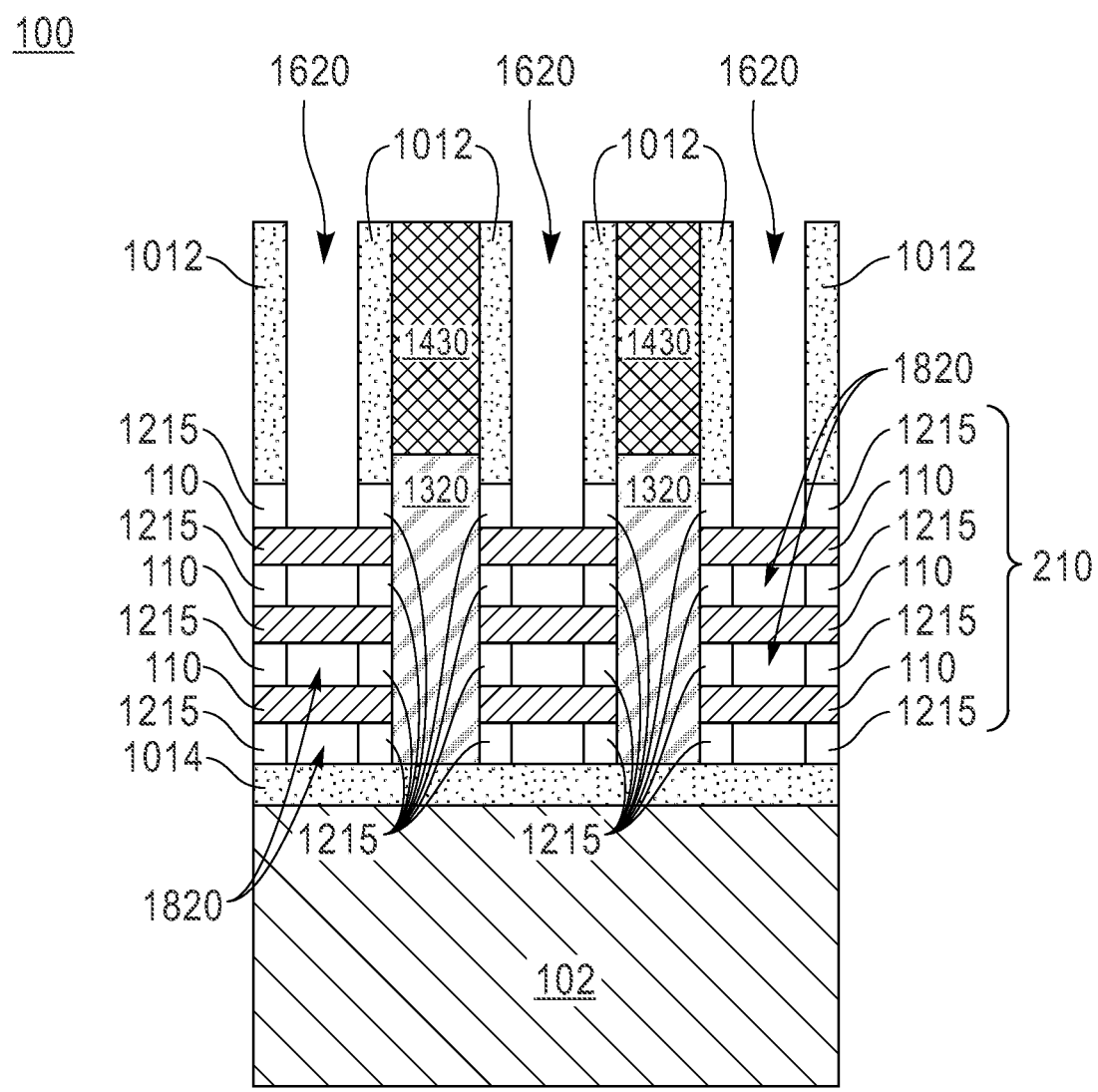
FIG. 18A is a cross-sectional view of the semiconductor structure taken along line A-A', as shown in FIG. 1, depicting removing the sacrificial semiconductor layers, according to an embodiment of the present disclosure.
Figure 18C:
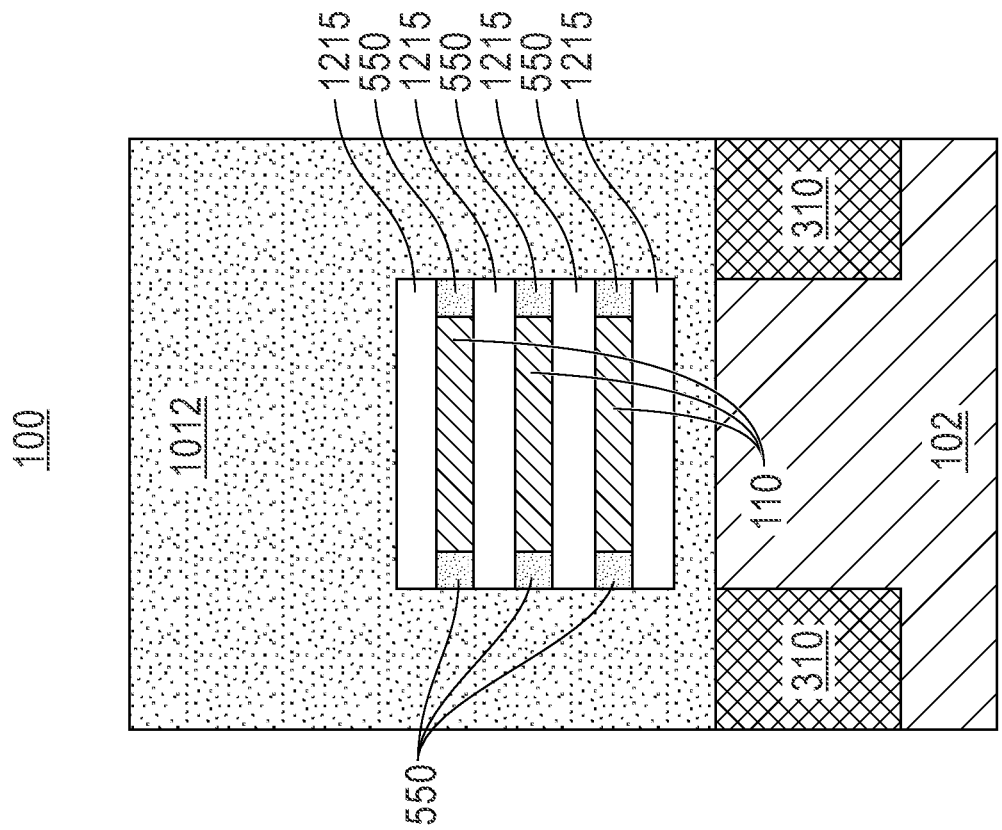
FIG. 18C is a cross-sectional view of the semiconductor structure 100 taken along line C-C', as shown in FIG. 1.
Figure 18B:
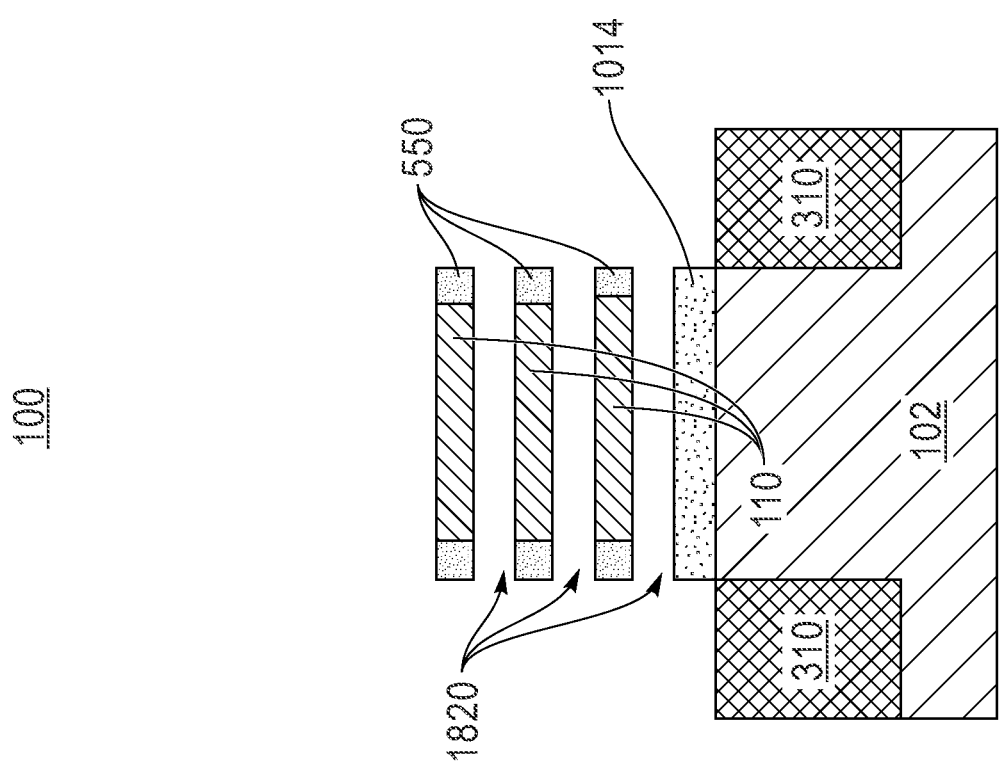
FIG. 18B is a cross-sectional view of the semiconductor structure taken along line B-B', as shown in FIG. 1.

Referring now to FIGS. 18A-18C, cross-sectional views of the semiconductor structure 100 are shown after removing the sacrificial semiconductor layers 108, according to an embodiment of the present disclosure. In this embodiment, FIG. 18A is a cross-sectional view of the semiconductor structure 100 taken along line A-A', as depicted in FIG. 1; FIG. 18B is a cross-sectional view of the semiconductor structure 100 taken along line B-B', as depicted in FIG. 1; and FIG. 18C is a cross-sectional view of the semiconductor structure 100 taken along line C-C', as depicted in FIG. 1.

The sacrificial semiconductor layers 108 can now be removed from the semiconductor structure 100. In an exemplary embodiment, the sacrificial semiconductor layers 108 can be removed by known etching processes including, for example, RIE, wet etch or dry gas (HCl). Removal of the sacrificial semiconductor layers 108 create second recesses 1820 between inner spacers 1215 and semiconductor channel layers 110 that will subsequently be filled with corresponding work function metals, as will be described in detail below.

It should be noted that the presence of the first dielectric layer 550 in the gate and spacer regions protects the edges of the semiconductor channel layers 110. Thus, the etching step conducted on the sacrificial semiconductor layers 108 (FIGS. 12A-12C) do not damage the semiconductor channel layers 110. By doing this edges of the semiconductor channel layers 110 preserve a substantially squared shape, unlike typical current SiGe release processes in which the etch chemistry can damage the nanosheet channel layers causing rounded or oval-shaped edges that in turn reduces the Tsi at the nanosheet channel edges and the overall $W_{\it eff}$. Accordingly, by forming the first dielectric layer 550, indentation and etching of the sacrificial semiconductor layers 108 can be conducted without damaging the semiconductor channel layers 110, thereby eliminating Tsi and $W_{\it eff}$ reduction issues.

Figure 19A:
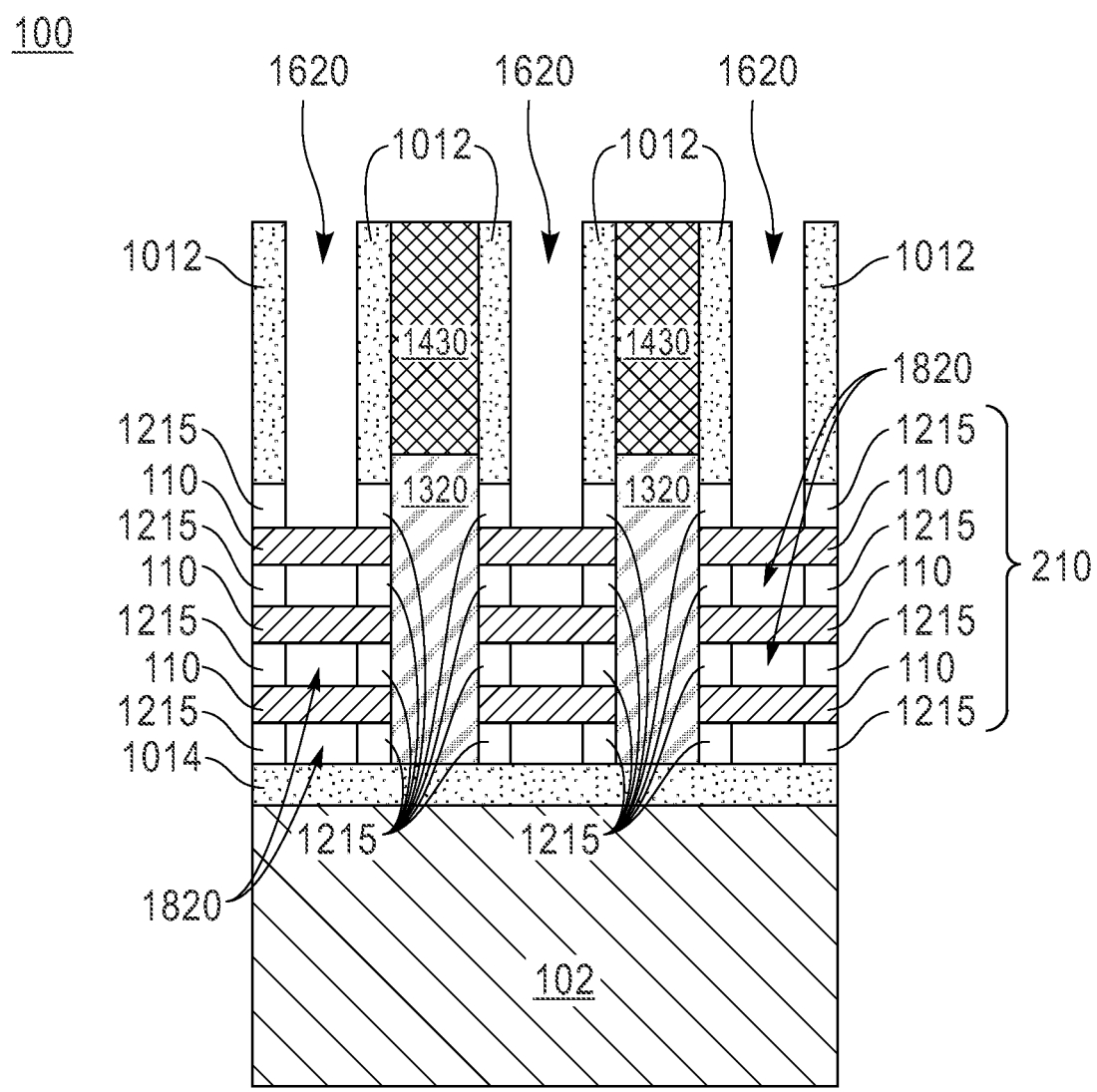
FIG. 19A is a cross-sectional view of the semiconductor structure taken along line A-A', as shown in FIG. 1, depicting conducting a high-k pre-clean, according to an embodiment of the present disclosure.
Figure 19C:
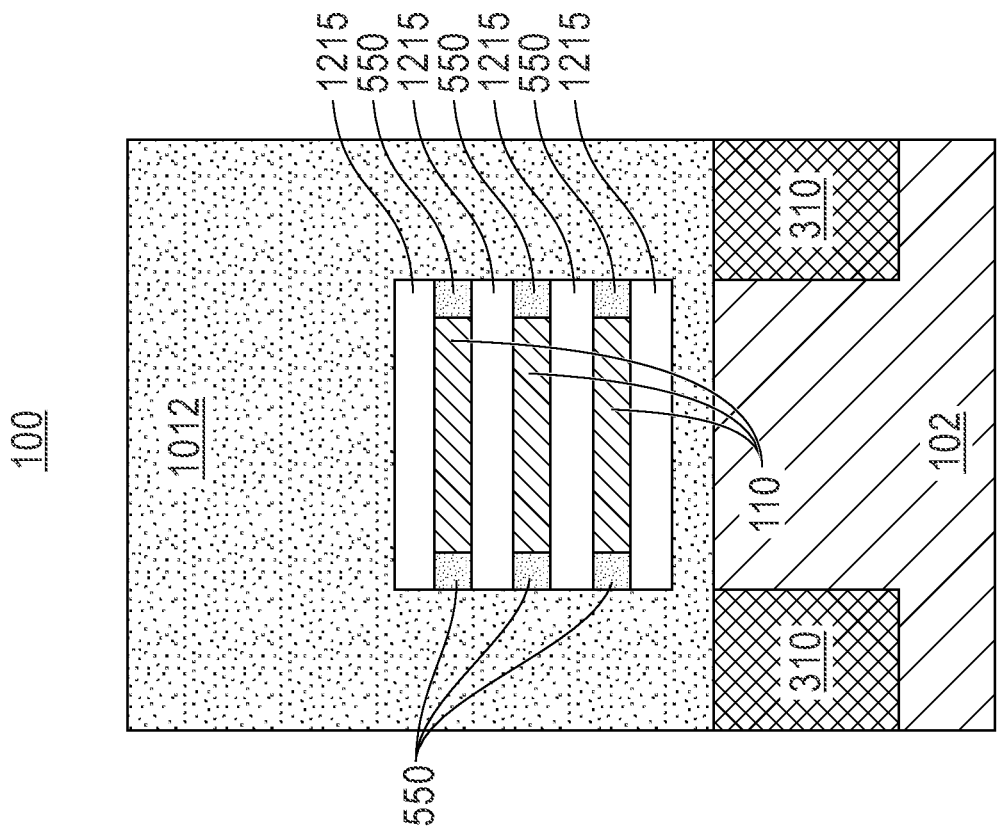
FIG. 19C is a cross-sectional view of the semiconductor structure 100 taken along line C-C', as shown in FIG. 1.
Figure 19B:
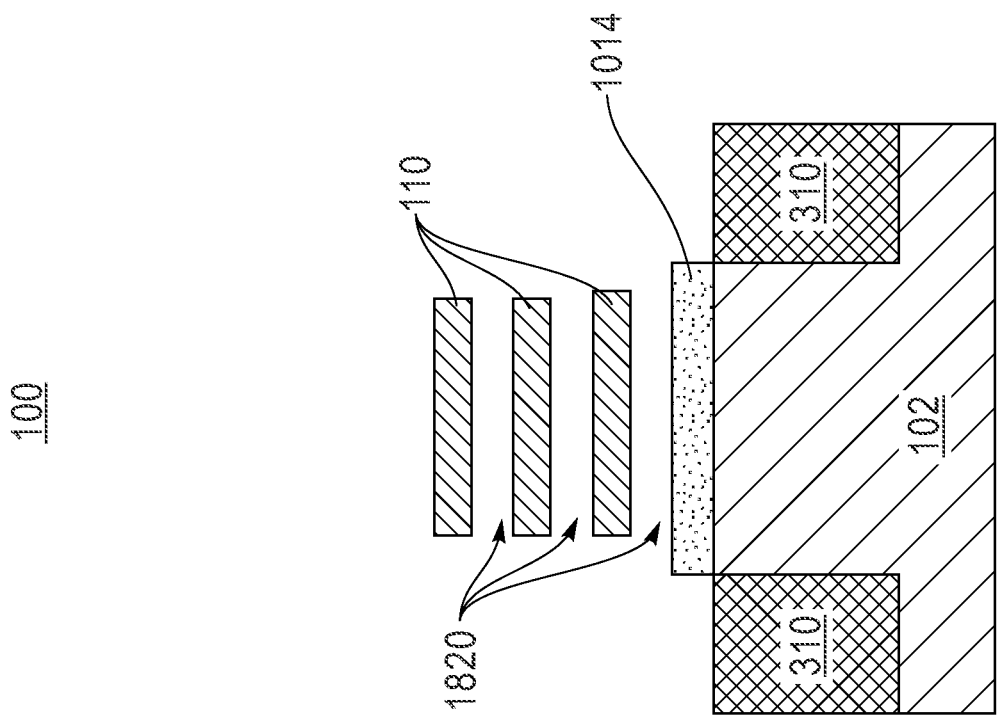
FIG. 19B is a cross-sectional view of the semiconductor structure taken along line B-B', as shown in FIG. 1.

Referring now to FIGS. 19A-19C, cross-sectional views of the semiconductor structure 100 are shown after conducting a high-k pre-clean, according to an embodiment of the present disclosure. In this embodiment, FIG. 19A is a cross-sectional view of the semiconductor structure 100 taken along line A-A', as depicted in FIG. 1; FIG. 19B is a cross-sectional view of the semiconductor structure 100 taken along line B-B', as depicted in FIG. 1; and FIG. 19C is a cross-sectional view of the semiconductor structure 100 taken along line C-C' as depicted in FIG. 1.

At this step, a high-k pre-clean is conducted on the semiconductor structure 100 in preparation for deposition of workfunction metals. During the high-k pre-clean remaining second portions of the first dielectric layer 550 in contact with opposite ends of the semiconductor channel layers 110 in the gate region (FIG. 18B) are consumed, as depicted in FIG. 19B. It should be noted that third portions of the first dielectric layer 550 remain on opposite ends of the silicon channel layers 110 between inner spacers 1215, as depicted in FIG. 19C (i.e., spacer region).

Figure 20A:
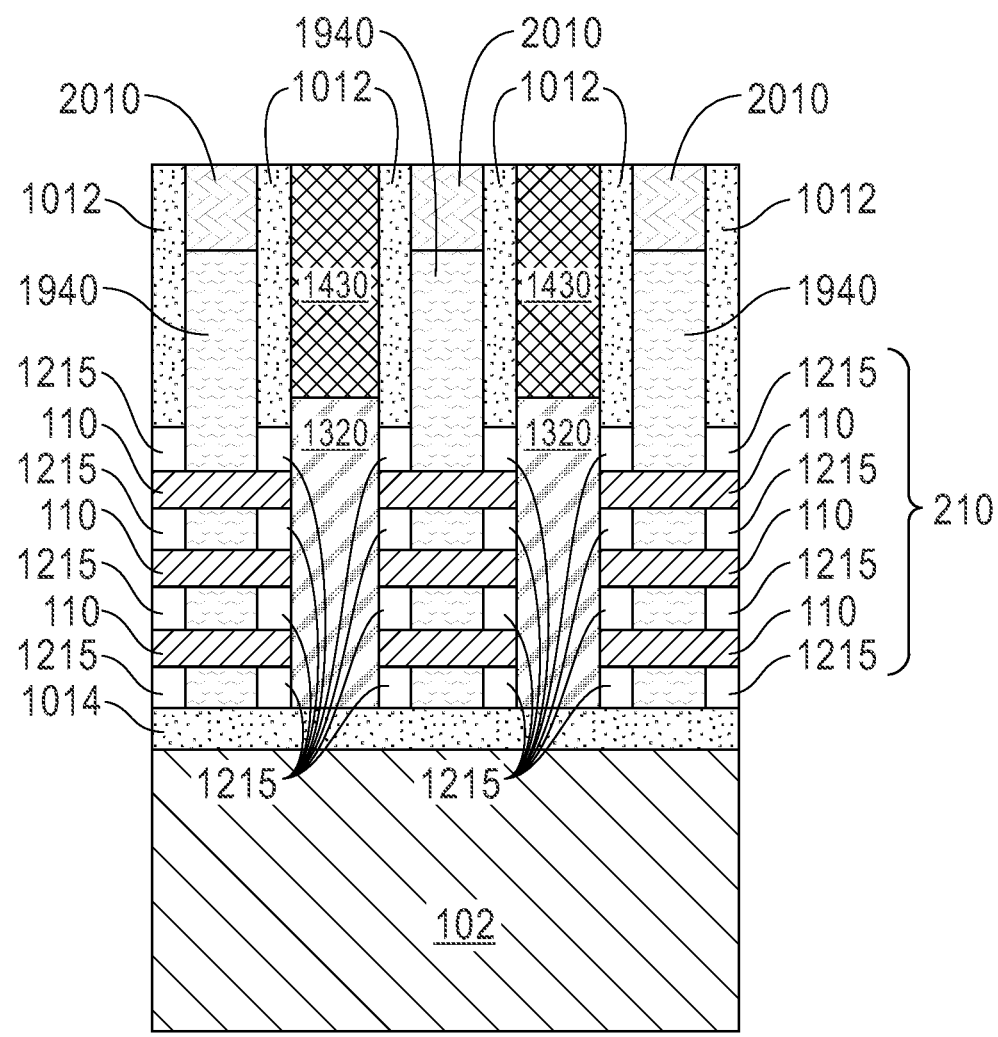
FIG. 20A is a cross-sectional view of the semiconductor structure taken along line A-A', as shown in FIG. 1, depicting forming a replacement metal gate structure, according to an embodiment of the present disclosure.
Figure 20C:
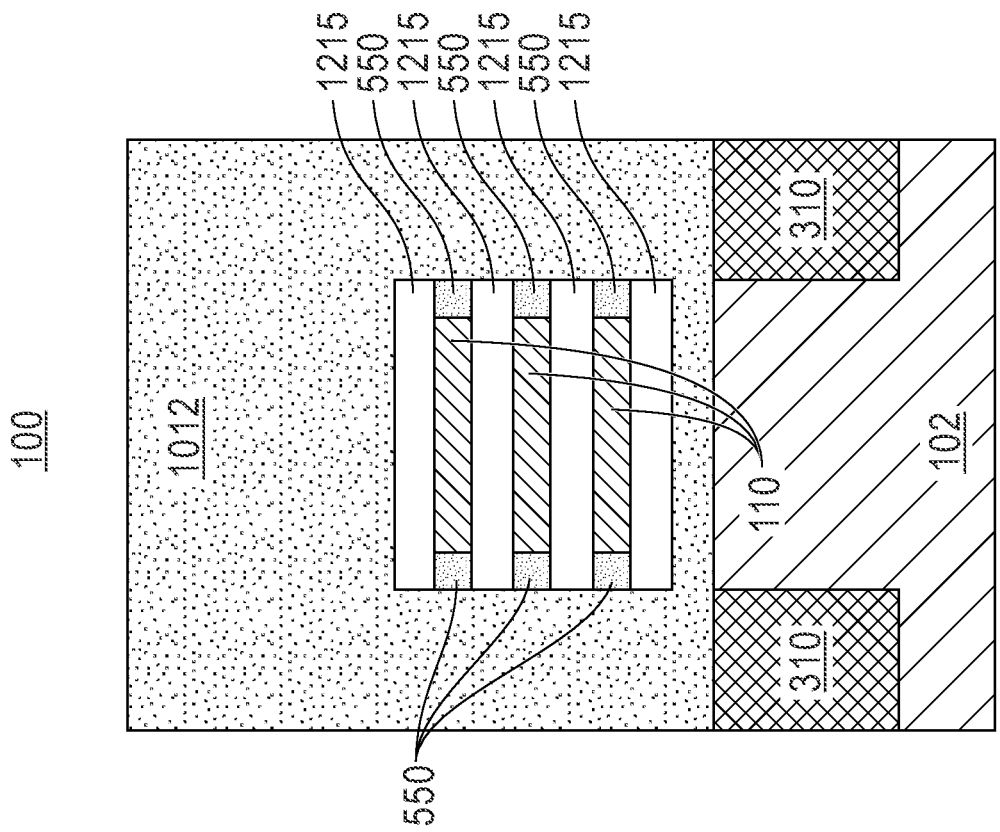
FIG. 20C is a cross-sectional view of the semiconductor structure 100 taken along line C-C', as shown in FIG. 1.
Figure 20B:
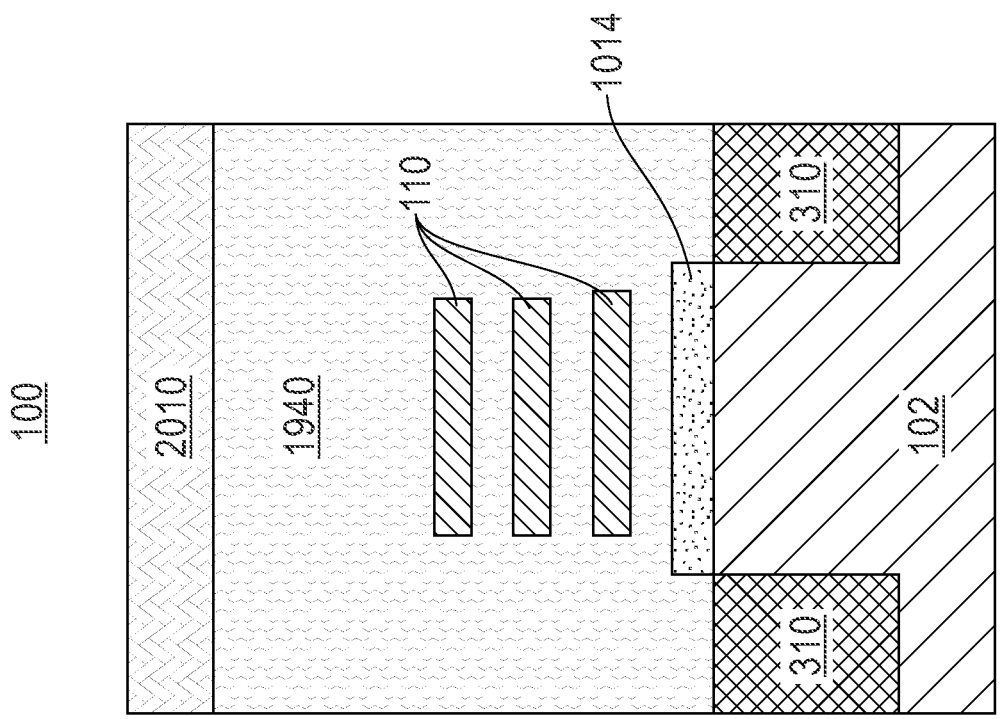
FIG. 20B is a cross-sectional view of the semiconductor structure taken along line B-B', as shown in FIG. 1.

Referring now to FIGS. 20A-20C, cross-sectional views of the semiconductor structure 100 are shown after forming a replacement metal gate structure, according to an embodiment of the present disclosure. In this embodiment, FIG. 20A is a cross-sectional view of the semiconductor structure 100 taken along line A-A', as depicted in FIG. 1; FIG. 20B is a cross-sectional view of the semiconductor structure 100 taken along line B-B', as depicted in FIG. 1; and FIG. 20C is a cross-sectional view of the semiconductor structure 100 taken along line C-C', as depicted in FIG. 1.

In this step, a metal gate stack 1940 and a self-aligned contact cap (hereinafter referred to as "metal cap") 2010 are formed in the semiconductor structure 100. Although not shown in the figures, a gate dielectric stack is typically formed before depositing the metal gate stack 1940 and metal cap 2010.

The metal gate stack 1940 and metal cap 2010 are formed within the first recess 1620 and second recesses 1820 shown in FIGS. 19A-19B. The metal gate stack 1940 may include one or more work function metals such as, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 20B, the metal gate stack 1940 surrounds the semiconductor channel layers 110. The gate cap 2010 is subsequently formed above the metal gate stack 1940. The material forming the gate cap 2010 may fill any remaining opening between the metal gate stack 1940 and sidewall spacer 1012. The material forming the gate cap 2010 may be aluminum oxide (AlOx), although other materials such as silicon nitride (SiN) may also or alternatively be used.

In embodiments in which the gate dielectric stack (not shown) is present, the gate dielectric stack may include a layer of silicon oxide and a layer of a high-k dielectric material, such as a hafnium based material.

After forming the metal gate stack 1940 and the gate cap 2010, a chemical mechanical polishing (CMP) may be conducted to remove excess material and polish upper surfaces of the semiconductor structure 100.

Figure 21A:
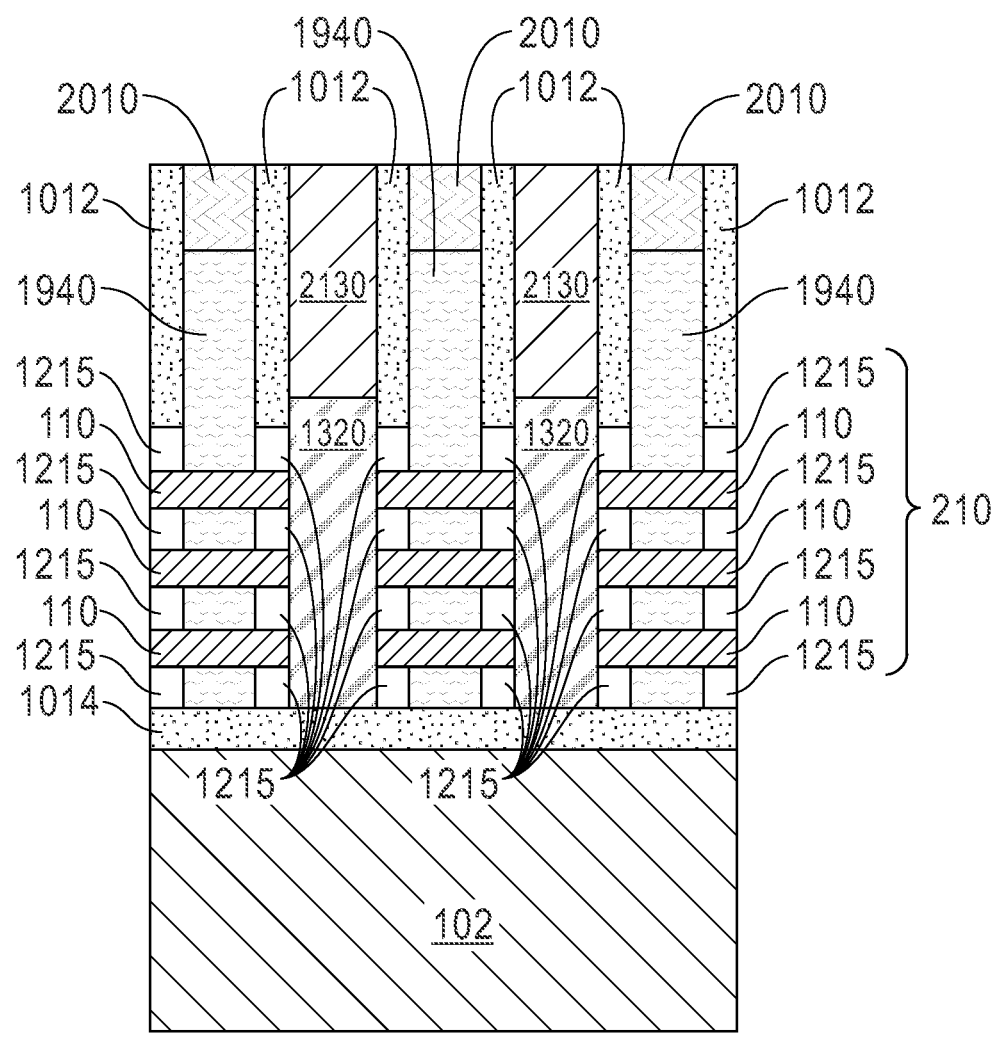
FIG. 21A is a cross-sectional view of the semiconductor structure taken along line A-A', as shown in FIG. 1, depicting forming source/drain contacts, according to an embodiment of the present disclosure.
Figure 21C:
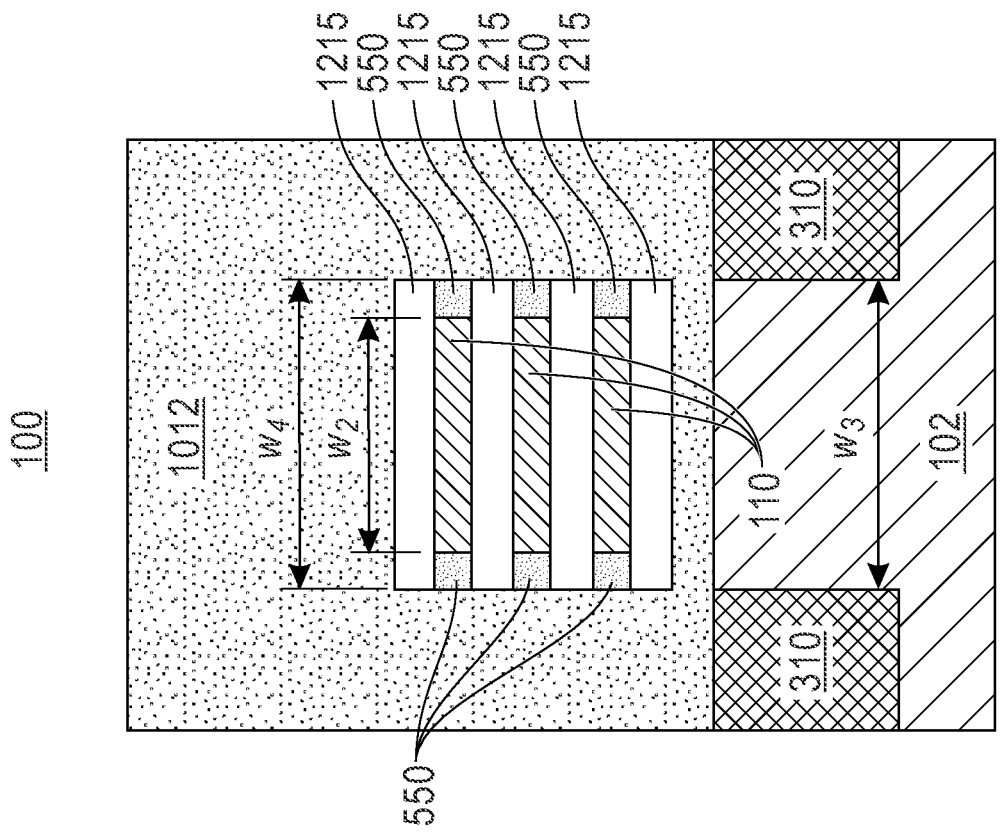
FIG. 21C is a cross-sectional view of the semiconductor structure 100 taken along line C-C', as shown in FIG. 1.
Figure 21B:
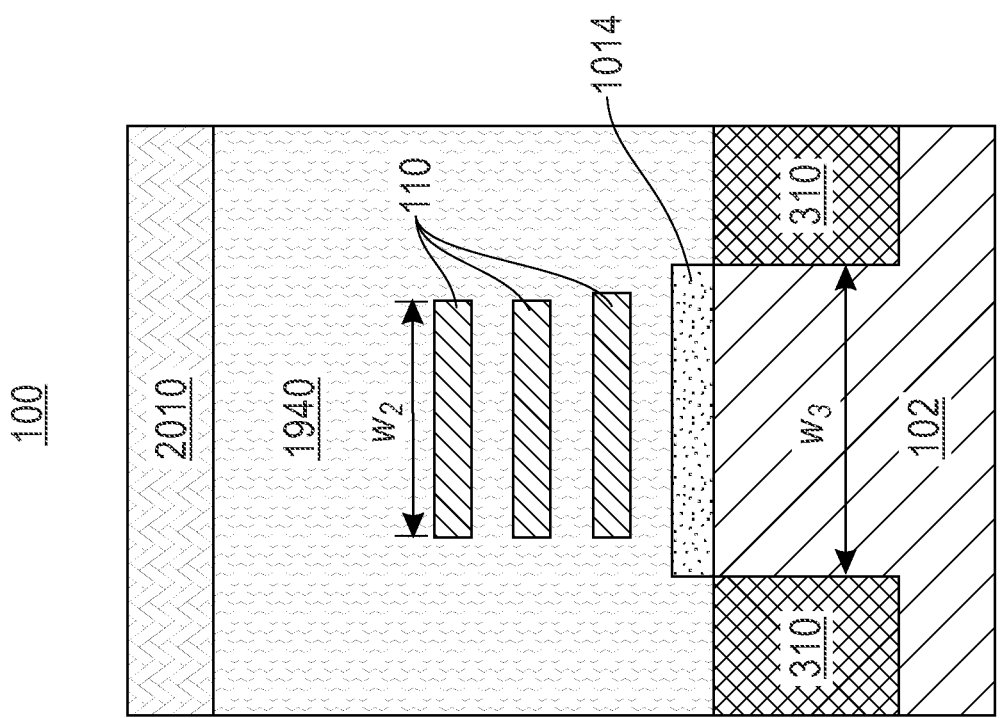
FIG. 21B is a cross-sectional view of the semiconductor structure taken along line B-B', as shown in FIG. 1.

Referring now to FIGS. 21A-21C, cross-sectional views of the semiconductor structure 100 are shown after forming source/drain contacts 2130, according to an embodiment of the present disclosure. In this embodiment, FIG. 21A is a cross-sectional view of the semiconductor structure 100 taken along line A-A', as depicted in FIG. 1; FIG. 21B is a cross-sectional view of the semiconductor structure 100 taken along line B-B', as depicted in FIG. 1; and FIG. 21C is a cross-sectional view of the semiconductor structure 100 taken along line C-C', as depicted in FIG. 1.

As illustrated in FIG. 21A, the second dielectric layer 1430 is removed using any suitable etching technique and replaced with a contact metal to form source/drain contacts 2130. The source/drain contacts 2130 are in contact with an uppermost surface of the source/drain regions 1320. Stated differently, source/drain contacts 2130 are electrically connected to the source/drain regions 1320. The process of forming the source/drain contacts 2130 is standard and well-known in the art. Typically, the process includes forming trenches (e.g., by removing the second dielectric layer 1430) and subsequently filling the trenches with a conductive material or a combination of conductive materials to form the source/drain contacts 2130. The conductive material filling the source/drain contacts 2130 includes a conductive metal, for example, aluminum (Al), platinum (Pt), gold (Au), tungsten (W), titanium (Ti), Cobalt (Co) or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100.

Although not shown in the figures, gate contacts to the metal gate stack 1940 may also be formed on the semiconductor structure 100 using similar conductive materials and analogous processing techniques as for the source/drain contacts 2130.

It should be noted that, the third portions of the first dielectric layer 550 remain in the spacer region of the semiconductor structure 100. However, the first dielectric layer 550 has been removed from the fin and gate regions, as depicted in FIGS. 21A and 21B. As can be appreciated in FIGS. 21B-21C, due to the indentation of the semiconductor channel layers 110 to form the first dielectric layer 550, a width $W_2$ of the semiconductor channel layers 110 is less than a width $W_3$ of a region of the semiconductor substrate 102 located between the STI regions 310. A total width $W_4$ of the semiconductor channel layers 110 and the remaining third portions of the first dielectric layer 550 is substantially equal to the width $W_3$ of the region of the semiconductor substrate 102 located between the STI regions 310, which is also substantially the same as a width of the inner spacer 1215.

Therefore, embodiments of the present disclosure provide a semiconductor structure, and a method of making the same, in which edges of the semiconductor nanosheet channels are protected by a dielectric layer for enhancing device performance. Particularly, the previously described embodiments provide a semiconductor structure in which (i) edges of the semiconductor nanosheet channels are protected by a first dielectric in the gate and spacer regions; (ii) the first dielectric and the semiconductor nanosheet channels are sandwiched between the inner spacers in the spacer region; (iii) the edges of the semiconductor nanosheet channel layers have a square shape; and (iv) the width ($w_2$) of the semiconductor nanosheet channel layers is smaller than the width of the sub-fin ($w_3$).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a plurality of channel layers vertically stacked over a substrate;
    an inner spacer located between each of the plurality of channel layers;
    source/drain regions in contact with opposite ends of a first portion of the plurality of channel layers; and
    a first dielectric layer located on opposite ends of a second portion of the plurality of channel layers located in a spacer region that is adjacent to the source/drain regions, a width of the first dielectric layer and the second portion of the plurality of channel layers being equal to a width of the inner spacer located between each of the plurality of channel layers.

2. The semiconductor structure of claim 1, further comprising:
    a metal gate stack surrounding the plurality of channel layers and separated from the source/drain regions by the inner spacer.

3. The semiconductor structure of claim 2, further comprising:
    a first portion of a sidewall spacer surrounding the first dielectric layer and the inner spacer in the spacer region; and
    a second portion of the sidewall spacer located along opposite sidewalls of the metal gate stack.

4. The semiconductor structure of claim 3, further comprising:
    a bottom dielectric isolation layer located between an uppermost surface of the substrate and a bottom surface of the source/drain regions and the metal gate stack, the bottom dielectric isolation layer isolating the source/drain regions and the metal gate stack from the substrate.

5. The semiconductor structure of claim 3, further comprising:
    source/drain contacts in contact with an uppermost surface of the source/drain regions, the source/drain contacts being separated from the metal gate stack by the second portion of the sidewall spacer.

6. The semiconductor structure of claim 1, further comprises:
    a portion of the substrate below the plurality of channel layers being located between shallow trench isolation regions.

7. The semiconductor structure of claim 6, wherein a width of the plurality of channel layers is less than a width of the portion of the substrate located between the shallow trench isolation regions.

8. The semiconductor structure of claim 1, wherein the first dielectric layer protects edges of the plurality of channel layers in the spacer region such that the edges of the plurality of channel layers have a substantially square shape.

9. The semiconductor structure of claim 1, wherein the plurality of channel layers comprises at least one of a nanosheet, a nanowire, and a nano-ellipse.

10. A method of forming a semiconductor structure, comprising:
forming a plurality of channel layers vertically stacked over a substrate;
forming an inner spacer between each of the plurality of channel layers;
forming source/drain regions in contact with opposite ends of a first portion of the plurality of channel layers; and
forming a first dielectric layer on opposite ends of a second portion of the plurality of channel layers located on a spacer region that is adjacent to the source/drain regions, a width of the first dielectric layer and the second portion of the plurality of channel layers being equal to a width of the inner spacer located between each of the plurality of channel layers.

11. The method of claim 10, further comprising:
forming a nanosheet stack on the substrate, the nanosheet stack comprising a nanosheet stack sacrificial layer above the substrate and an alternating sequence of sacrificial semiconductor nanosheets and channel layers from the plurality of channel layers;
patterning the nanosheet stack to form a nanosheet fin;
etching lateral portions of the plurality of channel layers to form an indentation region on opposite ends of the plurality of channel layers;
conformally depositing the first dielectric layer for pinching-off the indentation region;
forming a dummy gate on the nanosheet fin; and
selectively removing the nanosheet stack sacrificial layer from the nanosheet stack, wherein removing the nanosheet stack sacrificial layer creates an opening between the nanosheet fin and the substrate.

12. The method of claim 11, further comprising:
conformally depositing a spacer material to form a sidewall spacer along opposite sidewalls of the dummy gate, the spacer material filling the opening between the nanosheet fin and the substrate;
removing portions of the spacer material above an uppermost channel layer of the plurality of channel layers; and
using the sidewall spacer along sidewalls of the dummy gate as a mask, etching the nanosheet fin in a way such that a remaining portion of the nanosheet fin is vertically aligned with the sidewall spacer.

13. The method of claim 12, further comprising:
forming the inner spacer on opposite sides of the sacrificial semiconductor nanosheets;
epitaxially growing the source/drain regions; and
forming a second dielectric layer above the source/drain regions and between portions of the sidewall spacer adjacent to the source/drain regions.

14. The method of claim 13, further comprising:
removing the dummy gate, wherein removing the dummy gate creates first recesses between the portions of the sidewall spacer adjacent to the source/drain regions;
selectively etching portions of the first dielectric layer located in contact with the sacrificial semiconductor nanosheets;
selectively removing the sacrificial semiconductor nanosheets; and
conducting a high-k pre-clean process that removes remaining portions of the first dielectric layer from a gate region.

15. The method of claim 14, further comprising:
forming a metal gate stack within the first recesses, the metal gate stack surrounding the plurality of channel layers and being separated from the source/drain regions by the inner spacer.

16. The method of claim 15, wherein a first portion of the sidewall spacer surrounds the first dielectric layer and the inner spacer on the spacer region, and a second portion of the sidewall spacer is located along opposite sidewalls of the metal gate stack.

17. The method of claim 16, further comprising:
forming a bottom dielectric isolation layer between an uppermost surface of the substrate and a bottom surface of the source/drain region and the metal gate stack, the bottom dielectric isolation layer isolating the source/drain regions from the substrate.

18. The method of claim of claim 17, further comprising:
forming source/drain contacts in contact with an uppermost surface of the source/drain regions, the source/drain contacts being separated from the metal gate stack by the bottom dielectric isolation layer.

19. The method of claim 10, further comprising:
forming shallow trench isolation regions on opposite sides of a portion of the substrate located below the plurality of channel layers.

20. The method of claim 19, wherein a width of the plurality of channel layers is less than a width of the portion of the substrate located between the shallow trench isolation regions.

* * * * *